United States Patent
Kim et al.

(10) Patent No.: US 7,927,951 B2
(45) Date of Patent: Apr. 19, 2011

(54) NON-VOLATILE MEMORY DEVICE AND METHOD OF OPERATING THE SAME

(75) Inventors: Tae-Whan Kim, Seoul (KR); Kae-Dal Kwack, Seoul (KR); Sang-Su Park, Gwangju (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 12/955,984

(22) Filed: Nov. 30, 2010

(65) Prior Publication Data

US 2011/0069555 A1 Mar. 24, 2011

Related U.S. Application Data

(62) Division of application No. 12/370,792, filed on Feb. 13, 2009, now Pat. No. 7,863,673.

(30) Foreign Application Priority Data

Feb. 15, 2008 (KR) .................................. 2008-13838

(51) Int. Cl.
*H01L 21/336* (2006.01)
*H01L 29/788* (2006.01)
(52) U.S. Cl. ........................................ 438/267; 257/320
(58) Field of Classification Search .......... 438/257–267; 257/314–324
See application file for complete search history.

(56) References Cited

U.S. PATENT DOCUMENTS

| | | | |
|---|---|---|---|
| 6,768,158 B2 | 7/2004 | Lee et al. | |
| 6,903,967 B2 | 6/2005 | Mathew et al. | |
| 7,402,862 B2 * | 7/2008 | Choi et al. | 257/324 |
| 7,723,188 B2 | 5/2010 | Kim et al. | |
| 7,863,673 B2 * | 1/2011 | Kim et al. | 257/320 |
| 2006/0270156 A1 | 11/2006 | Kim et al. | |

FOREIGN PATENT DOCUMENTS

| | | |
|---|---|---|
| KR | 1020030020644 A | 3/2003 |
| KR | 1020040104144 | 12/2004 |
| KR | 1020050112029 A | 11/2005 |

(Continued)

OTHER PUBLICATIONS

Yong Kyu Lee, Tae-Hun Kim, Sang Hoon Lee, Jong Duk Lee and Byung-Gook Park "Twin-Bit Silicon-Oxide-Nitride-Oxide-Silicon (SONOS) Memory by Inverted Sidewall Patterning (TSM-ISP)," IEEE Transactions on Nanotechnology, vol. 2, No. 4, Dec. 2003. pp. 246-252.

(Continued)

*Primary Examiner* — Calvin Lee
(74) *Attorney, Agent, or Firm* — Volentine & Whitt, P.L.L.C.

(57) ABSTRACT

A non-volatile memory device includes a semiconductor substrate, first and second control gates, and first and second charge storage patterns. The semiconductor substrate includes a protruding active pin having a source region, a drain region and a channel region located between the source and drain regions. The first control gate is located on a first sidewall of the channel region, and the second control gate is located on a second sidewall of the channel region. The second control gate is separated from the first control gate. The first charge storage pattern is located between the first sidewall and the first control gate, and the second charge storage pattern is located between the second sidewall and the second control gate.

4 Claims, 25 Drawing Sheets

FOREIGN PATENT DOCUMENTS

| | | |
|---|---|---|
| KR | 1020060031428 A | 4/2006 |
| KR | 1020060038129 A | 5/2006 |

OTHER PUBLICATIONS

Chiu-Chiao Chung, Hongchin Lin, You-Min Shen and Yen-Tai Lin, "A Multilevel Sensing and Program Verifying Scheme for Bi-NAND Flash Memories," 2005 IEEE VLSI-TSA International (2005) pp. 267-270.

Takahiko Hara et al., "A 146-mm2 8-Gb Multi-Level NAND Flash Memory With 70-nm CMOS Technology," IEEE Journal of Solid-state Circuits, vol. 41, No. 1 (Jan. 2006) pp. 161-169.

Tsu-Jae King, Future Directions: Taking Silicon to the Limit: Challenges and Opportunities, The Electrochemical Society Interface, Spring 2005. pp. 38-40.

Donald A. Neamen, Semiconductor Physics and Devices 3rd edition, (2003) pp. 346-347.

* cited by examiner

X-X'

Y-Y'

X-X'

Y-Y'

X-X'

Y-Y'

X-X'

Y-Y'

X-X'

Y-Y'

X-X'

Y-Y'

X-X'

Y-Y'

NON-VOLATILE MEMORY DEVICE AND METHOD OF OPERATING THE SAME

CROSS-REFERENCE TO RELATED APPLICATIONS

This application is a divisional application of application Ser. No. 12/370,792 filed on Feb. 13, 2009, which claims priority from Korean Patent Application No. 10-2008-0013838, filed Feb. 15, 2008, the entire contents of which are hereby incorporated by reference.

SUMMARY

The present invention generally relates to a non-volatile memory device, and more particularly, to a multi-bit non-volatile memory device and to an operational method thereof.

Multi-level non-volatile memory cells (also referred to as multi-bit non-volatile memory cells) are capable of storing two or more bits of data in each memory cell. For example, in the case of a two-bit cell, the charge storage element (pattern) of each cell is capable of being programmed into any one of four different charge states. However, highly complex peripheral circuit designs are needed to accurately program each cell into four charge states which can be reliably distinguished from one another. Circuit designs become even more complex and difficult to implement in the case of higher bit counts in which five or more distinguishable charge states must be programmed.

Embodiments of the present invention provide a non-volatile memory device that includes a semiconductor substrate, first and second control gates, and first and second charge storage patterns. The semiconductor substrate includes a protruding active pin, the protruding active pin having a source region, a drain region and a channel region located between the source and drain regions. The first control gate is located on a first sidewall of the channel region, and the second control gate is located on a second sidewall of the channel region. The second control gate is separated from the first control gate. The first charge storage pattern is located between the first sidewall and the first control gate, and the second charge storage pattern is located between the second sidewall and the second control gate.

In various embodiments, the channel region includes a top wall extending between the first and second sidewalls, each of the first and second control gates partially extending over the top wall of the channel regions. Also, the first charge storage pattern extends between the top wall of the channel region and the first control gate, and the second charge storage pattern extends between the top wall of the channel region and the second control gate. The channel region is recessed relative to the source and drain regions.

In various embodiments, the non-volatile memory device further includes a first word line connected to the first control gate and a second word line connected to the second control gate.

In various embodiments, the non-volatile memory device further includes a tunneling insulation layer between each of the first and second charge storage patterns and the first and second sidewalls of the channel region, respectively. Also, the non-volatile memory device further includes a blocking insulation layer between each of the first and second charge storage patterns and the first and second control gates, respectively.

Embodiments of the present invention provide a data programming method of a non-volatile memory device. The method includes storing a charge in a first charge storage pattern or a second charge storage pattern by applying a programming electric field between a semiconductor substrate and a first control gate or between the semiconductor substrate and a second control gate, respectively.

Embodiments of the present invention provide a data erasing method of a non-volatile memory device. The method includes erasing charges stored in a first charge storage pattern and a second charge storage pattern by applying an erase electric field between a semiconductor substrate and first and second control gates, respectively.

Embodiments of the present invention provide a data reading method of a non-volatile memory device. The method includes sensing a drain current by applying a reference voltage to a source region, applying a drain read voltage to a drain region, and applying a gate read voltage to a first control gate; and sensing the drain current by applying a reference voltage to the source region, applying a drain read voltage to the drain region, and applying a gate read voltage to a second control gate.

BRIEF DESCRIPTION OF THE FIGURES

The attached drawings illustrate exemplary and non-limiting embodiments of the present invention, in which.

DETAILED DESCRIPTION OF EMBODIMENTS

Figure 1:
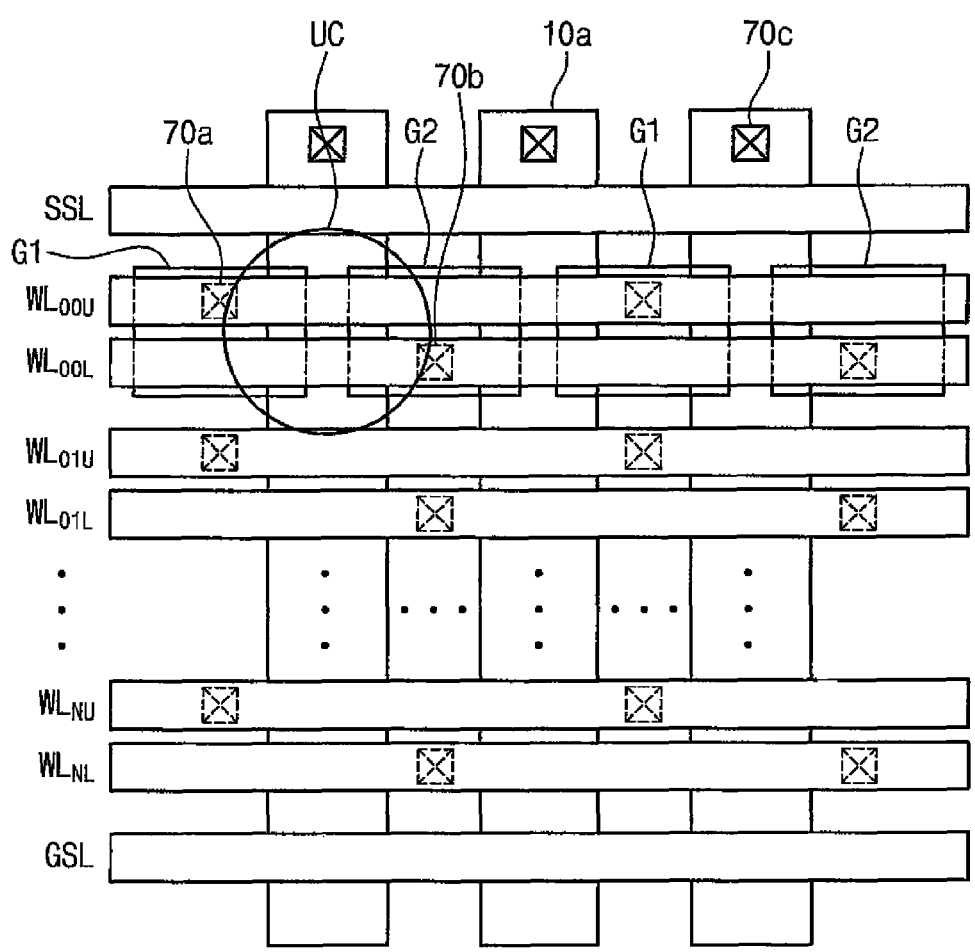
FIG. 1 is a block diagram illustrating a layout of a cell array of a non-volatile memory device, according to an embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Further, the dimensions of layers and regions are exaggerated for clarity of illustration.

FIG. 1 is a block diagram showing a cell array layout of a non-volatile memory device, according to an illustrative embodiment of the present invention.

Referring to FIG. 1, active pins 10a, defined by a device isolation layer formed in a semiconductor substrate, are arranged laterally in one direction. A string selection line SSL and a ground selection line GSL cross over the active pins 10a. Further, in the representative cell array layout, multiple word line pairs $WL_{00U}$-$WL_{00L}$, $WL_{01U}$-$WL_{01L}$, ..., $WL_{NU}$-$WL_{NL}$ cross over the active pins 10a between the string selection line SSL and the ground selection line GSL. The word lines $WL_{00U}$ ... $WL_{NU}$ are referred to as first word lines, and the word lines $WL_{00P}$ ... $WL_{NP}$ are referred to second word lines.

Pairs of gate patterns G1 and G2 are arranged spaced apart from each other and located between the active pin 10a and the pair of word lines $WL_{NU}$-$WL_{NL}$. The gate patterns G1 and G2 overlap opposite sidewalls of the active pin 10a, respectively, and extend over the top of the active pin 10a. Accordingly, at least a portion of the top of the active pin 10a may be exposed between the pair of gate patterns G1 and G2.

In the cell array, the first word lines $WL_{00U}$, $WL_{01U}$, ..., $WL_{NU}$ are electrically connected to the first gate patterns G1 through first contacts 70a, which may overlap one sidewall of the respective active pin 10a. The second word lines $WL_{00L}$, $WL_{01L}$, ..., $WL_{NL}$ are electrically connected to the second gate patterns G2 through second contacts 70b, which may overlap the other sidewall of the respective active pin 10a.

Bit lines (not shown) may be located on the word line pairs $WL_{00U}$-$WL_{00L}$, $WL_{01U}$-$WL_{01L}$, ..., $WL_{NU}$-$WL_{NL}$, and may be parallel to the active pins 10a. In an embodiment, the bit lines respectively contact the active pins 10a through third contacts 70c.

Figure 2:
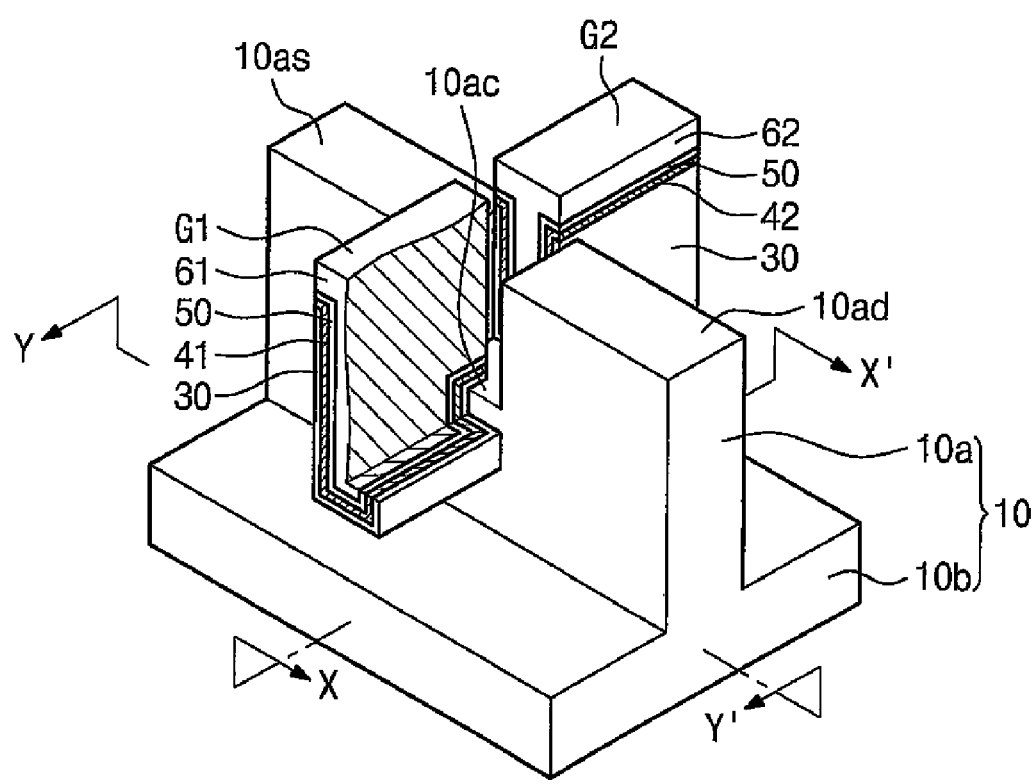
FIG. 2 is a partially cut-away perspective view illustrating a non-volatile memory cell of FIG. 1, according to an embodiment of the present invention.
Figure 3:
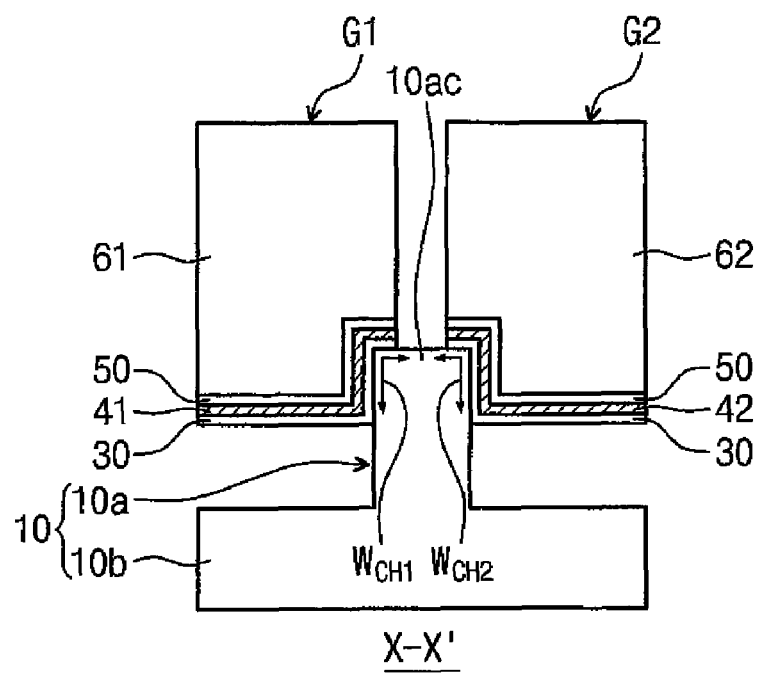
FIG. 3 shows cross-sectional views taken along lines X-X' and Y-Y', respectively, of FIG. 2, according to an embodiment of the present invention.
Figure 3:
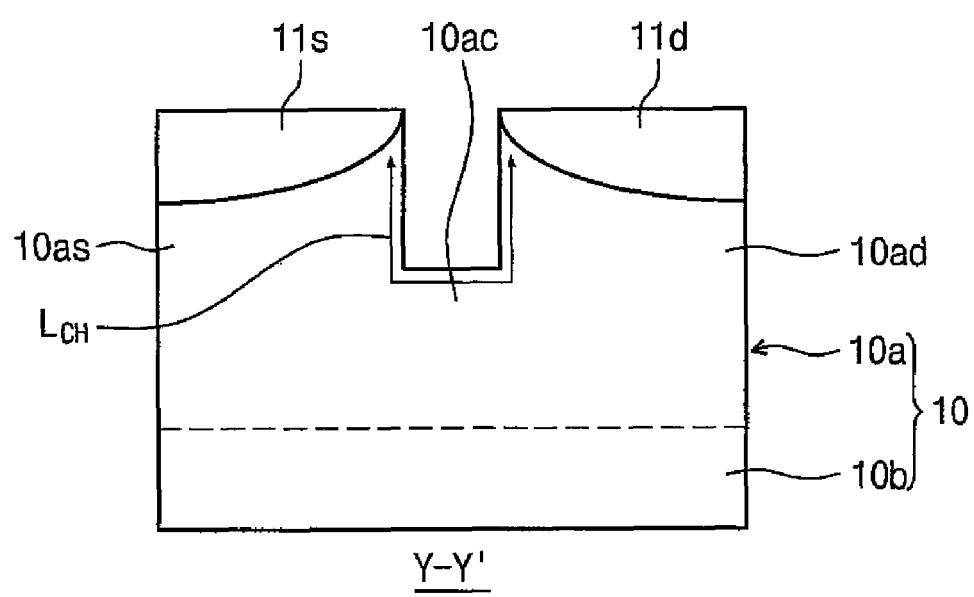

FIG. 2 is a partially cut-away perspective view showing a non-volatile memory cell of FIG. 1, according to an illustrative embodiment of the present invention. FIG. 3 shows cross-sectional views taken along lines X-X' and Y-Y', respectively, of FIG. 2, according to an illustrative embodiment of the present invention. Illustrations of word lines and device isolation layers are omitted from FIGS. 2 and 3 for convenience of description.

Referring to FIGS. 2 and 3, a semiconductor substrate 10 includes a base region 10b and an active pin 10a protruding from the base region 10b. The active pin 10a includes a source region 10as, a drain region 10ad, and a channel region 10ac located between the source/drain regions 10as and 10ad. A source impurity region 11s and a drain impurity region 11d are located in the source/drain regions 10as and 10ad, respectively. The source/drain impurity regions 11s and 11d may each include a high concentration impurity region and a low concentration impurity region.

The channel region 10ac is more recessed than the source/drain regions 10as and 10ad. The sum of the length of the channel region 10ac and height differences between the top of the channel region 10ac and the respective tops of the source/drain regions 10as and 10ad is defined as channel length $L_{CH}$. Accordingly, the channel length $L_{CH}$ is greater than that of a typical flat transistor, thus suppressing a short channel effect.

A first control gate 61 is located on a first sidewall (i.e., one sidewall) of the channel region 10ac. A charge storage pattern 41 is located between the first control gate 61 and the first side wall. The first control gate 61 may extend along a portion of the top of the channel region 10ac. At least a portion of the first charge storage pattern 41 extends between the top of the channel region 10ac and the first control gate 61.

A second control gate 62 is located on a second side wall (i.e., another sidewall) of the channel region 10ac. The second control gate 62 is separated from the first control gate 61 by a predetermined distance. A second charge storage pattern 42 is located between the second control gate 62 and the second sidewall. The second charge storage pattern 42 is electrically isolated from the first charge storage pattern 41. The second control gate 62 may extend along another portion of the top of the channel region 10ac. At least a portion of the second charge storage pattern 42 extends between the top of the channel region 10ac and the second control gate 62.

Each of the charge storage patterns 41 and 42, respectively arranged on sidewalls of the channel region 10ac, may have a charge state "0" or "1." That is, each of the charge storage patterns 41 and 42 is configured to store one bit individually. Accordingly, because two bits can be stored in a unit cell, twice as much information can be stored as compared to a one-bit unit cell, and programming error can be reduced compared to when four charge states are stored in a one charge storage pattern.

However, the charge storage patterns 41 and 42 are not limited to the above description. Each may have charge states of "00," "01," "10" and "11," individually. That is, each of the charge storage patterns 41 and 42 may store two bits. Therefore, a total of four bits can be stored in the unit cell.

Additionally, because the charge storage patterns 41 and 42 and the control gates 61 and 62 extend to the sidewalls and the top of the channel region 10ac, channel widths $W_{CH1}$ and $W_{CH2}$ are greater than those of a typical flat transistor, thus suppressing narrow width effect. Consequently, current driving capability is improved and distribution of a threshold voltage is reduced.

A tunnel insulation layer 30 is located between the change storage patterns 41 and 42 and the channel region 10ac. A blocking insulation layer 50 is located between the charge storage pattern 41 and 42 and the control gates 61 and 62. The tunnel insulation layer 30 and the blocking insulation layer 50 may be a silicon oxide layer, and the tunnel insulation layer 30 may be a thermal oxide layer, for example.

Each of the control gates 61 and 62 may be a stacked layer of polysilicon layers, or a polysilicon layer and a metal silicide layer, for example. Also, the metal silicide layer may be a tungsten silicide layer, a cobalt silicide layer, or a nickel silicide layer, for example.

The charge storage patterns 41 and 42 may be a charge trap layer, a floating gate, or an insulation layer including a conductive nano crystal, for example. More particularly, the charge trap layer may be a silicon nitride layer, and the floating gate may be a poly silicon layer, and the conductive nano crystal may be a silicon nano crystal or a metal nano crystal. When the charge storage patterns 41 and 42 are a charge trap layer or an insulation layer including a conductive nano crystal, the blocking insulation layer 50 may be omitted.

FIGS. 4A through 4F are perspective views showing a method of fabricating a non-volatile memory device, according to an illustrative embodiment of the present invention. FIGS. 5A through 5F are cross-sectional views taken along lines X-X' and Y-Y' of FIGS. 4A through 4F, according to an illustrative embodiment of the present invention.

Figure 4A:
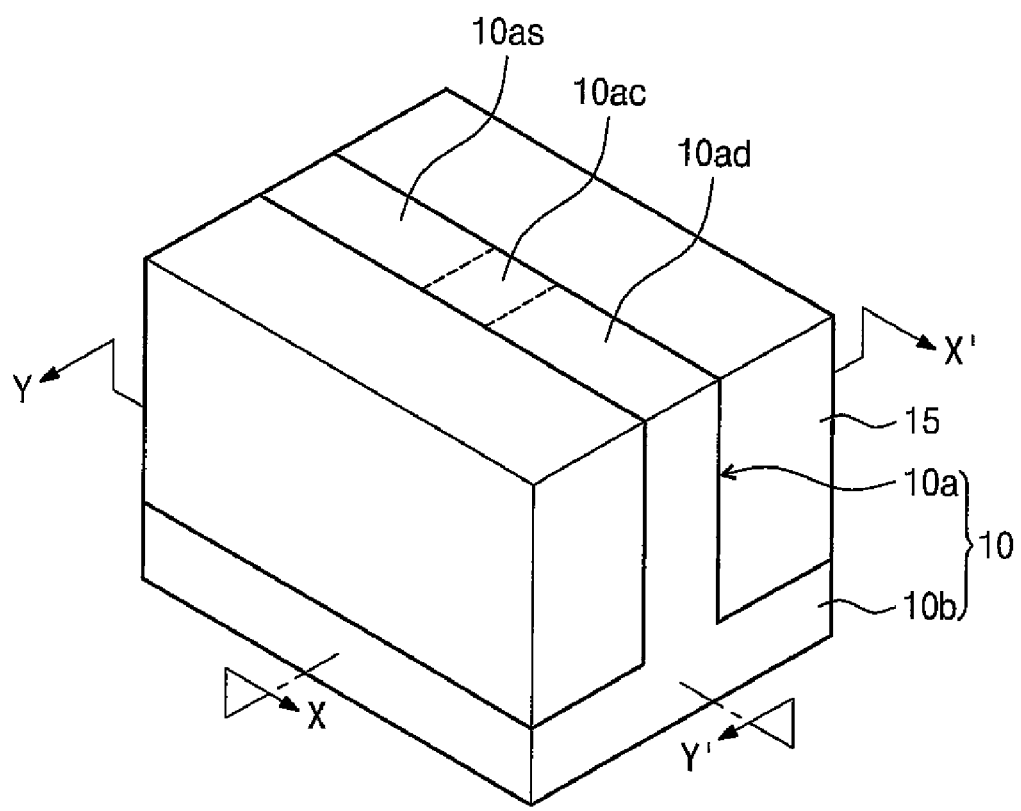
FIGS. 4A through 4F are perspective views for describing a method of fabricating a non-volatile memory device, according to an embodiment of the present invention.
Figure 5A:
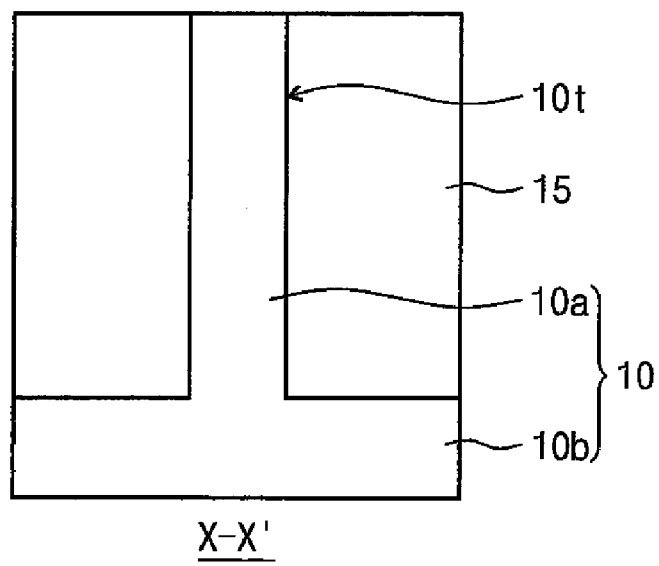
FIGS. 5A through 5F are cross-sectional views taken along lines X-X' and Y-Y' of FIGS. 4A through 4F, respectively, according to an embodiment of the present invention.
Figure 5A:
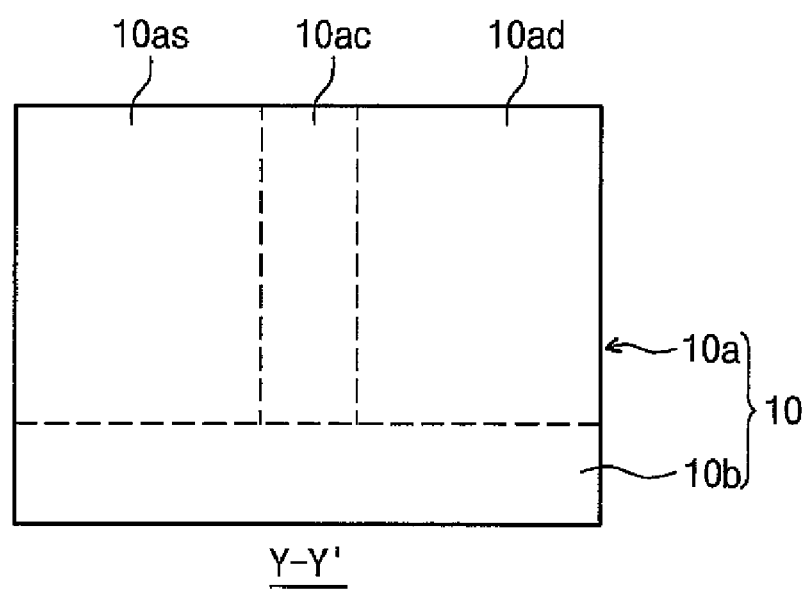

Referring to FIGS. 4A and 5A, an active pin 10a is defined by a device isolation trench 10t formed in semiconductor substrate 10. The active pin 10a protrudes from a base region 10b corresponding to a bottom portion of the device isolation trench lot. The active pin 10a includes a source region 10as, a drain region 10ad and a channel region 10ac between the source and drain regions 10as and 10ad.

A first insulation liner (not shown) may be formed on an inner wall of the device isolation trench 10t. The first insulation liner may be a thermal oxide layer, for example, formed by thermal-oxidizing the inner wall of the device isolation trench lot. The first insulation liner effectively repairs etching damage of the inner wall of the device isolation trench 10t, caused during formation of the isolation trench 10t. A second insulation liner (not shown) may be formed on the first insulation liner. The second insulation liner may be a silicon nitride layer, for example.

After the insulation liners filling the device isolation trench 10t are formed on the semiconductor substrate 10, a resulting device isolation insulation layer is planar-etched until the top of the active pattern 10a is exposed in order to form device isolation layer 15. The planar-etching of the device isolation insulation layer can be completed, for example, through a chemical-mechanical polishing (CMP) method. Also, the device isolation layer 15 may be a silicon oxide layer, for example, such as a high density plasma (HDP) oxide.

Figure 4B:
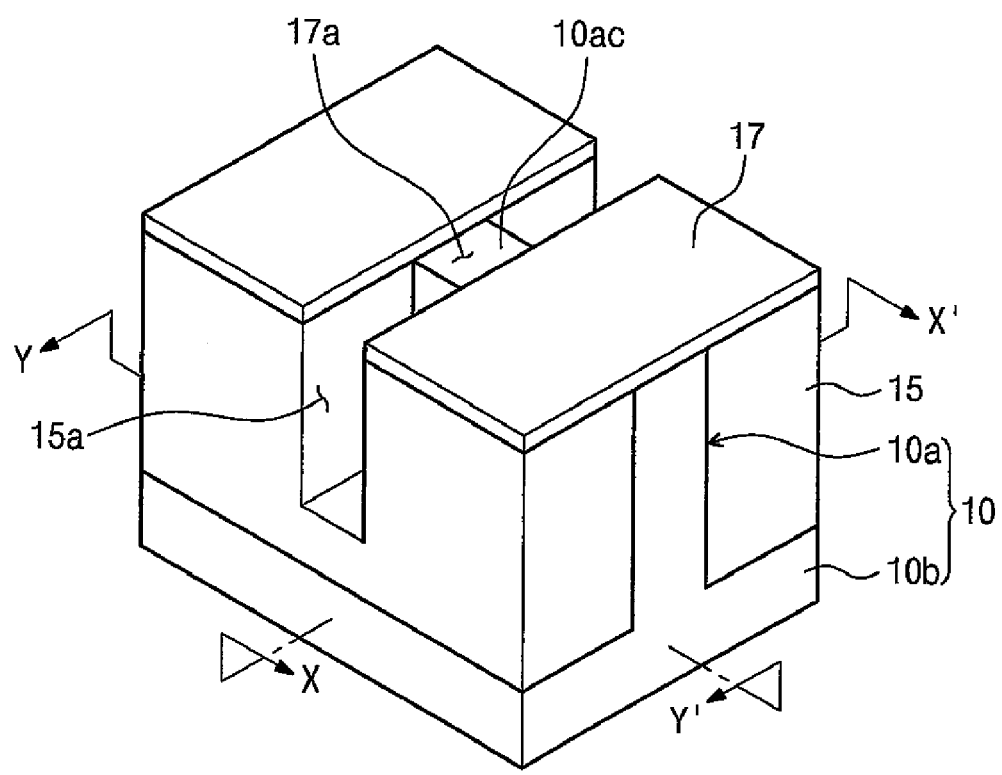
Figure 5B:
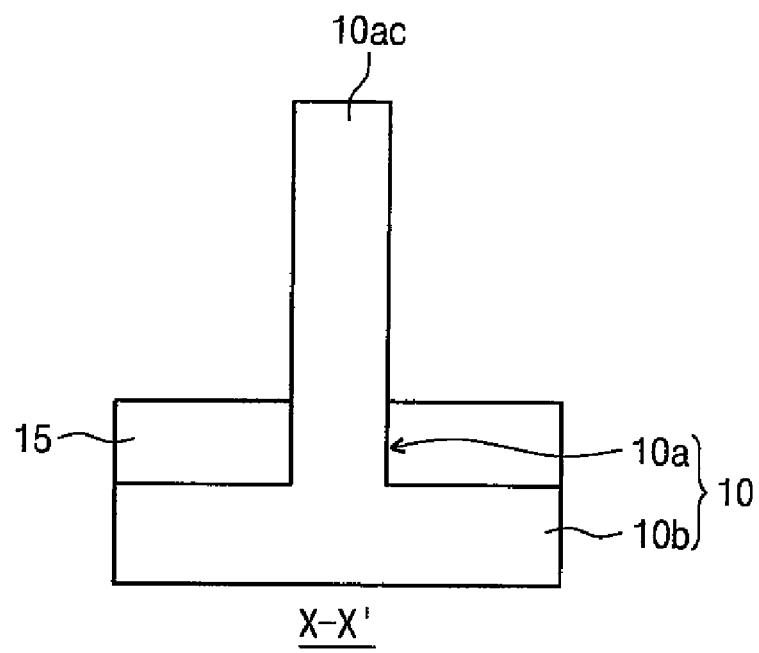
Figure 5B:
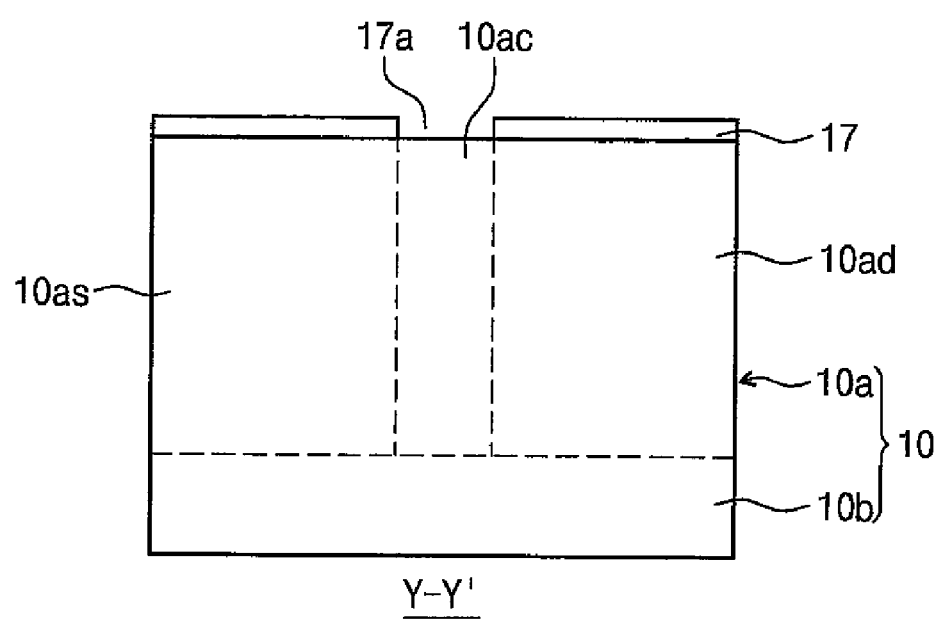

Referring to FIGS. 4B and 5B, an etching mask layer is formed on the active pin 10a and the device isolation layer 15, and an etching mask pattern 17, defining a slit 17a, is formed by patterning the etching mask layer. The slit 17a crosses over the top of the channel region 10ac. The etching mask pattern 17 may be formed by a layer having an etching selectivity with respect to the active pin 10a and the device isolation layer 15. The etching mask pattern 17 may be formed of a silicon nitride layer, for example.

By using the etching mask pattern 17 as a mask to etch a top portion of the device isolation layer 15 exposed through the slit 17a, a groove 15a is formed, exposing sidewalls of the channel region 10ac. The groove 15a may be formed through an anisotropic etching method, for example, using an etch recipe for selectively removing the device isolation layer 15 (i.e., having an etching selectivity with respect to the active pin 10a and the etching mask pattern 17).

Figure 4C:
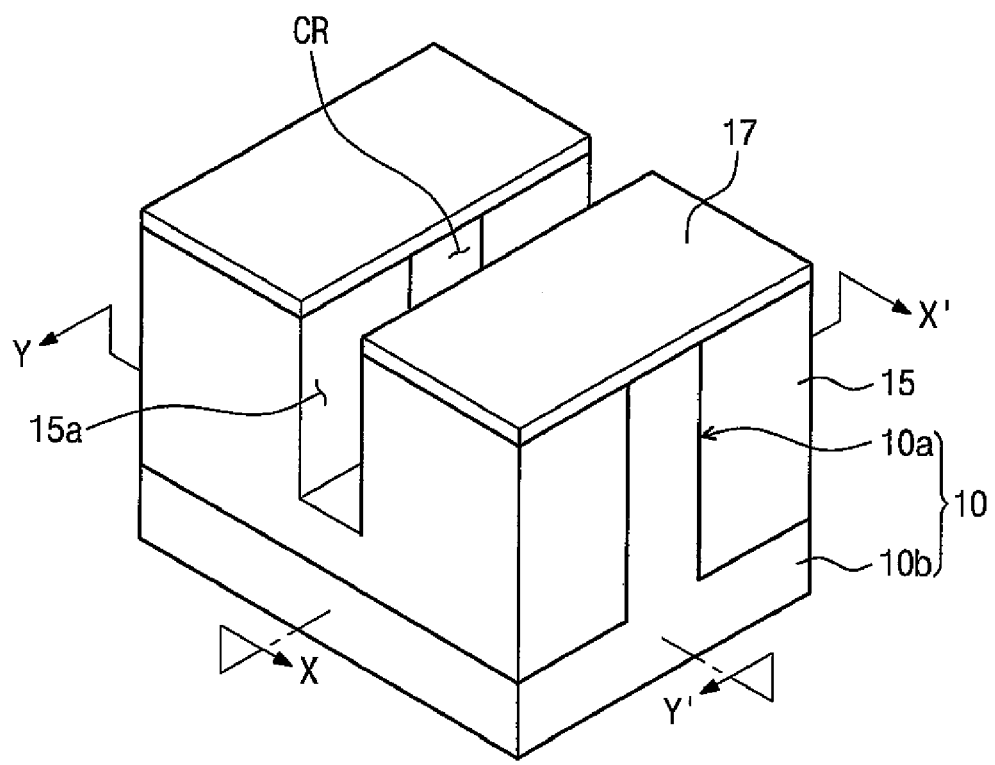
Figure 5C:
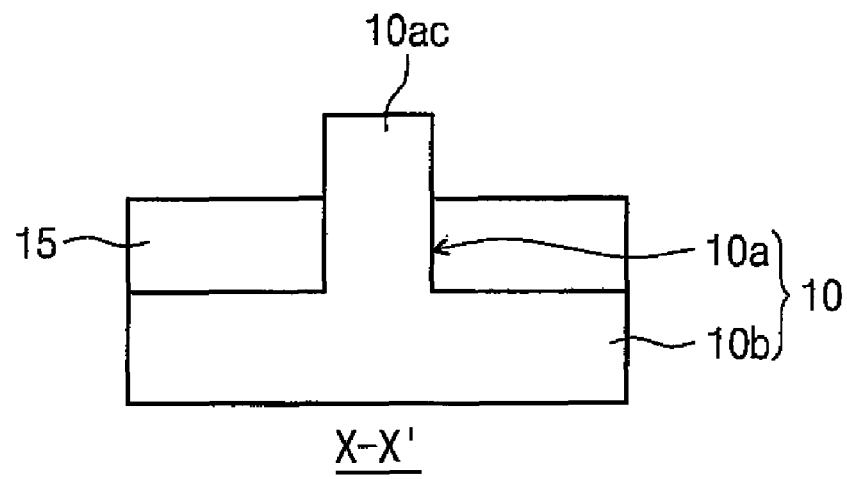
Figure 5C:
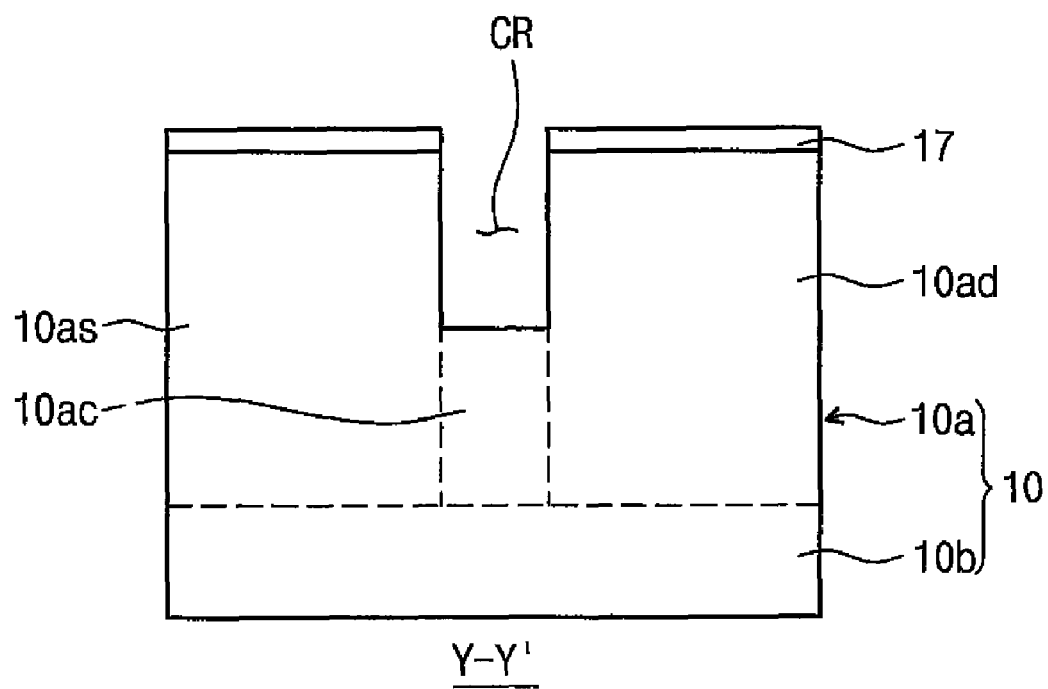

Referring to FIGS. 4C and 5C, use of the etching mask pattern 17 results in recessing the top region of the channel region 10ac exposed through the slit 17a. Consequently, a channel recess CR is formed on the recessed channel region 10ac. When recessing of the channel region 10ac, the recess amount is adjusted so that the top of the recessed channel region 10ac is higher than the bottom of the groove 15a. The recessing of the channel region 10ac may be completed through an anisotropic etching method, for example, using an etch recipe that does not etch the device isolation layer 15 and the etching mask pattern 17, but selectively etches the channel region 10ac.

Figure 4D:
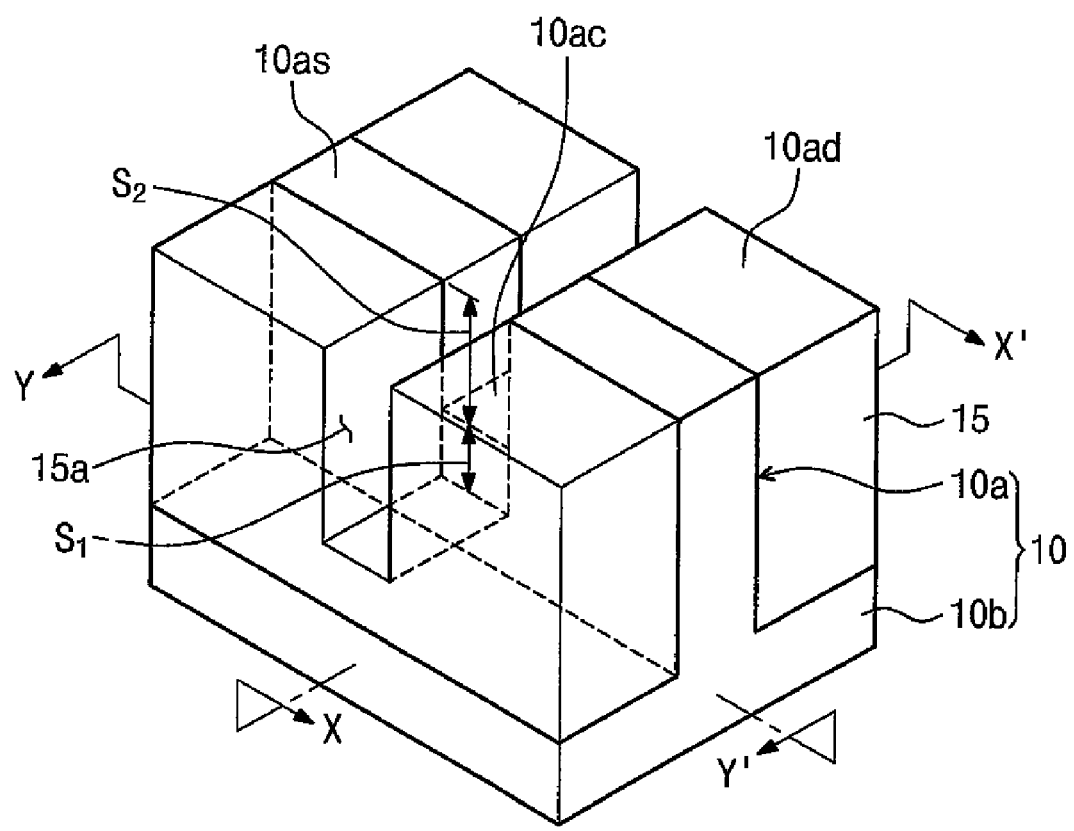
Figure 5D:
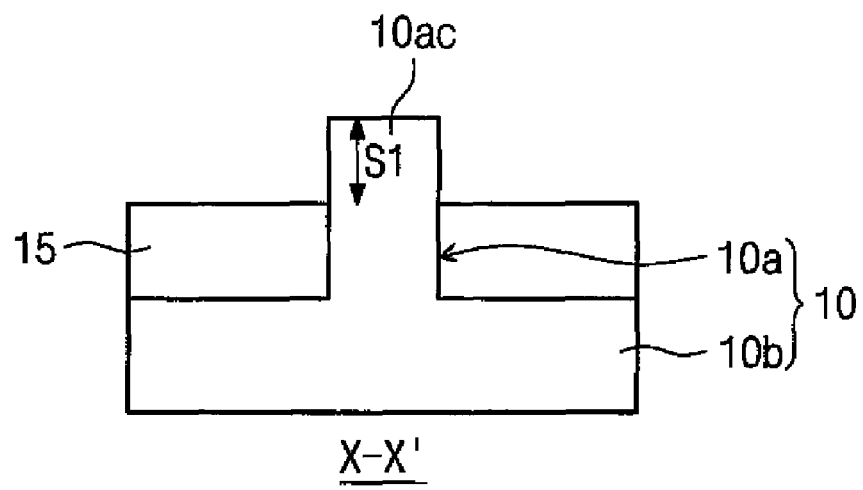
Figure 5D:
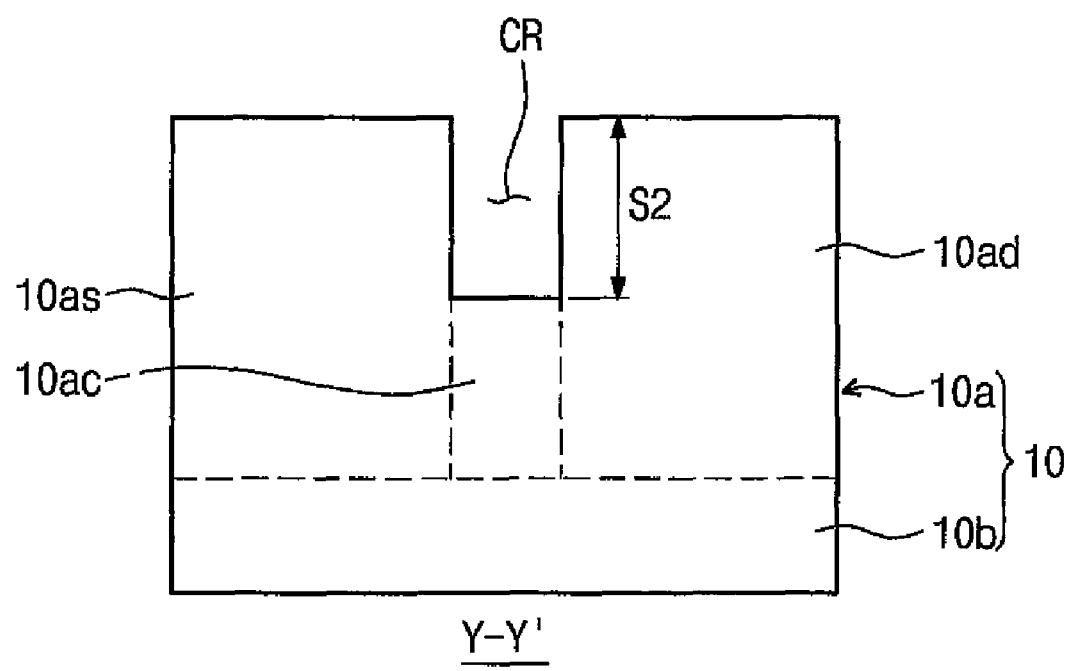

Referring to FIGS. 4D and 5D, the tops of the source/drain regions 10as and 10ad, and the top of the device isolation layer 15 are exposed by removing the etching mask pattern 17. A height difference S1 between the bottom of the groove 15a and the top of the recessed channel region 10ac factors in determining the channel widths $W_{CH1}$ and $W_{CH2}$ of a transistor. Furthermore, a height difference S2 between the top of the recessed channel region 10ac and the tops of the source/drain regions 10as and 10ad factors in determining the channel length $L_{CH}$.

Figure 4E:
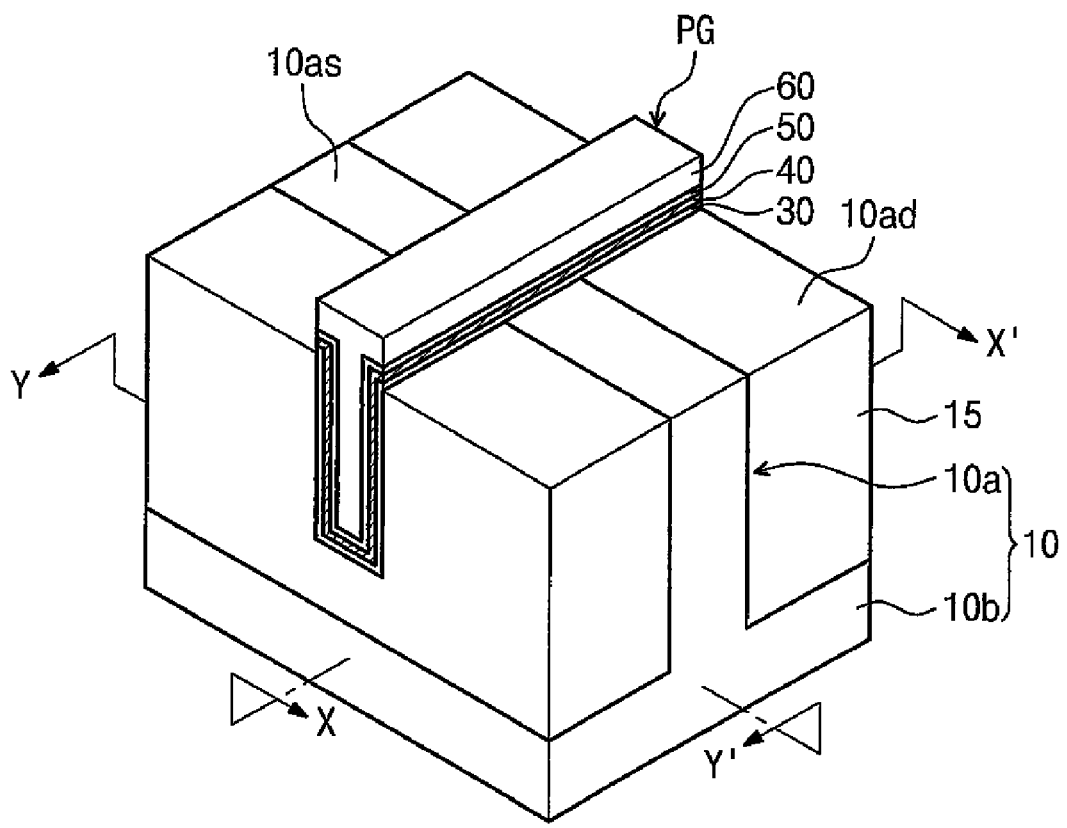
Figure 5E:
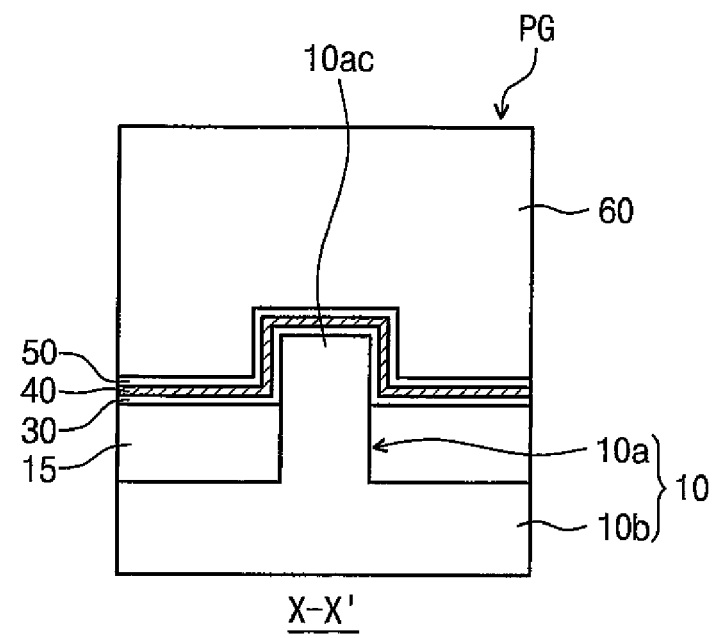
Figure 5E:
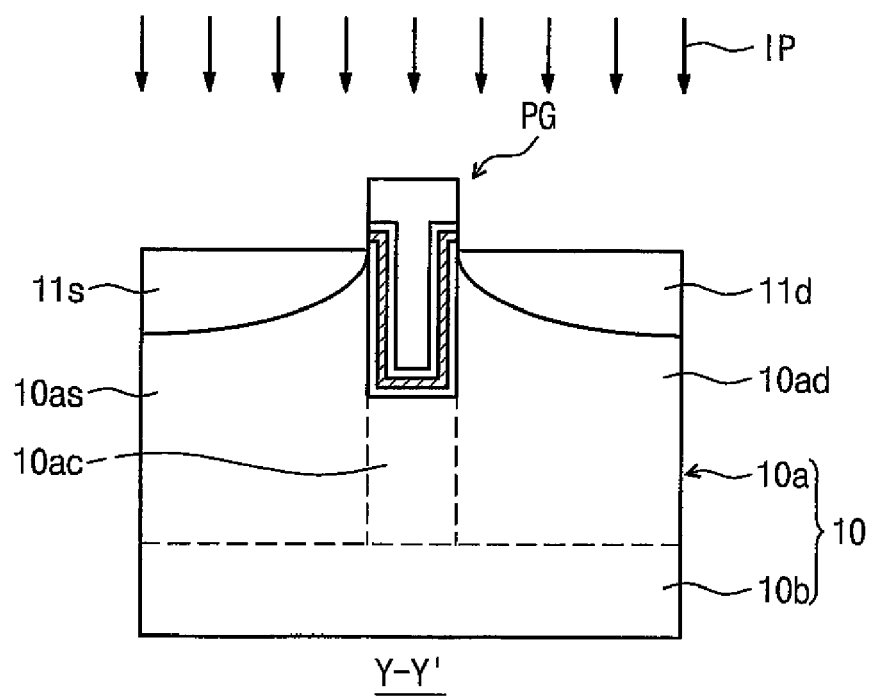

Referring to FIGS. 4E and 5E, a tunnel insulation layer 30 is formed where the etching mask pattern 17 has been removed. The tunnel insulation layer 30 may be a silicon oxide layer, for example. Furthermore, the tunnel insulation layer 30 may be a thermal oxide layer formed by thermal-oxidizing the active pin 10a.

A charge storage layer 40, a blocking insulation layer 50 and a control gate electrode layer 60 are sequentially formed on the semiconductor substrate 10 having the tunnel insulation layer 30. For example, the charge storage layer 40 may be a charge trap layer, a floating gate layer, or an insulation layer including a conductive nano crystal, and the blocking insulation layer 50 may be a silicon oxide layer. When the charge storage layer 40 is a charge trap layer or an insulation layer including the conductive nano crystal, the blocking insulation layer 50 may be omitted. The control gate electrode layer 60 is formed having a thickness that sufficiently fills the groove 15a and the channel recess CR.

A preliminary gate pattern PG is formed by sequentially patterning the control gate electrode layer 60, the blocking insulation layer 50, the charge storage layer 40 and the tunnel insulation layer 30. The preliminary gate pattern PG covers the sidewalls and the tops of the channel region 10ac and fills the groove 15a.

Through ion implantation IP using the preliminary gate pattern PG as a mask, source/drain impurity regions 11s and 11d are respectively formed in the source/drain regions 10as and 10ad. The source/drain impurity regions 11s and lid may include a low concentration impurity region (not shown) and a high concentration impurity region (not shown), respectively. In this case, after forming the low concentration impurity region through low concentration ion implantation using the preliminary gate pattern PG as a mask, high concentration ion implantation is performed after forming spacers (not shown) on the sidewalls of the preliminary gate pattern PG, such that high concentration impurity region can be formed.

Figure 4F:
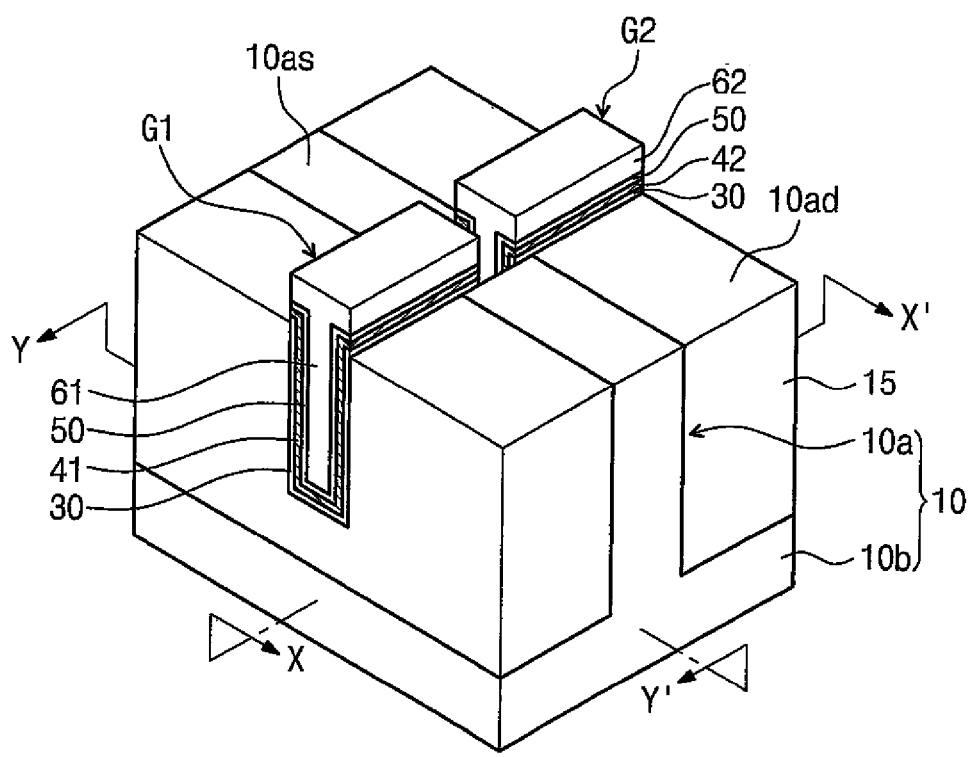
Figure 5F:
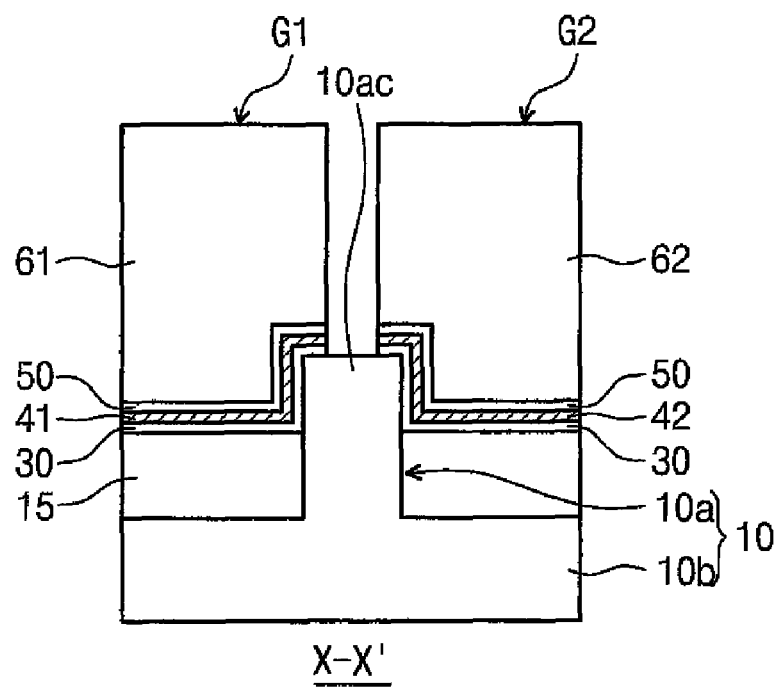
Figure 5F:
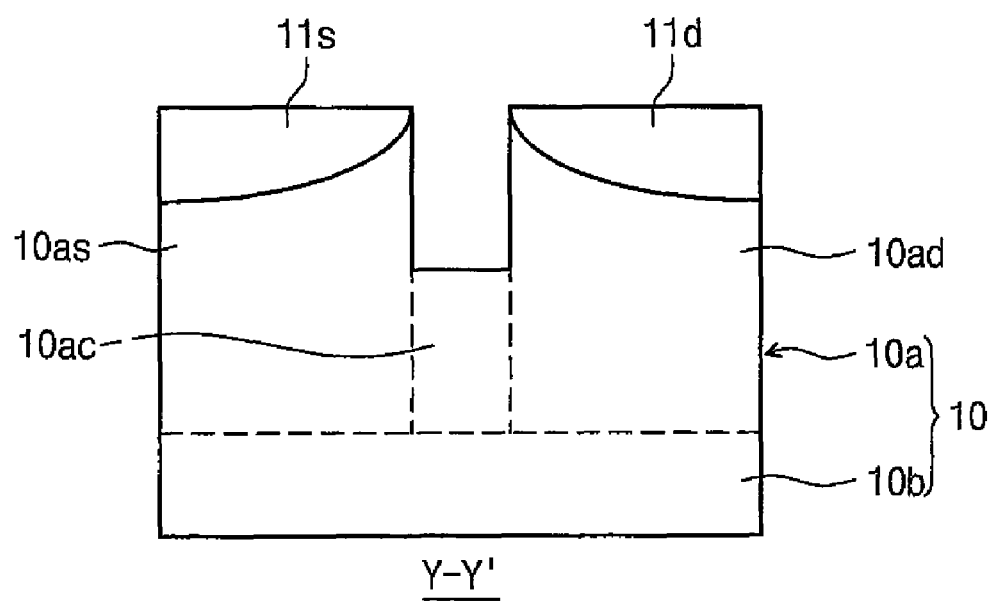

Referring to FIGS. 4F and 5F, first gate pattern G1 and second gate pattern G2 are formed, separated from one another, by partially removing the gate pattern PG on the top of the channel region 10ac. The first gate pattern G1 is located on one side wall of the channel region 10ac, i.e., a first sidewall, and extends over a portion of the top of the channel region 10ac. The second gate pattern G2 is located on another sidewall of the channel region 10ac, i.e., a second sidewall, and extends over another portion of the top of the channel region 10ac.

The first gate pattern G1 includes sequentially-stacked tunnel insulation layer 30, first charge storage pattern 41, blocking insulation layer 50 and first control gate 61. The second gate pattern G2 includes sequentially-stacked tunnel insulation layer 30, second charge storage pattern 42, blocking insulation layer 50 and second control gate 62.

Hereinafter, methods of operating a non-volatile memory device, according to illustrative embodiments of the present invention, will be described.

Figure 6:
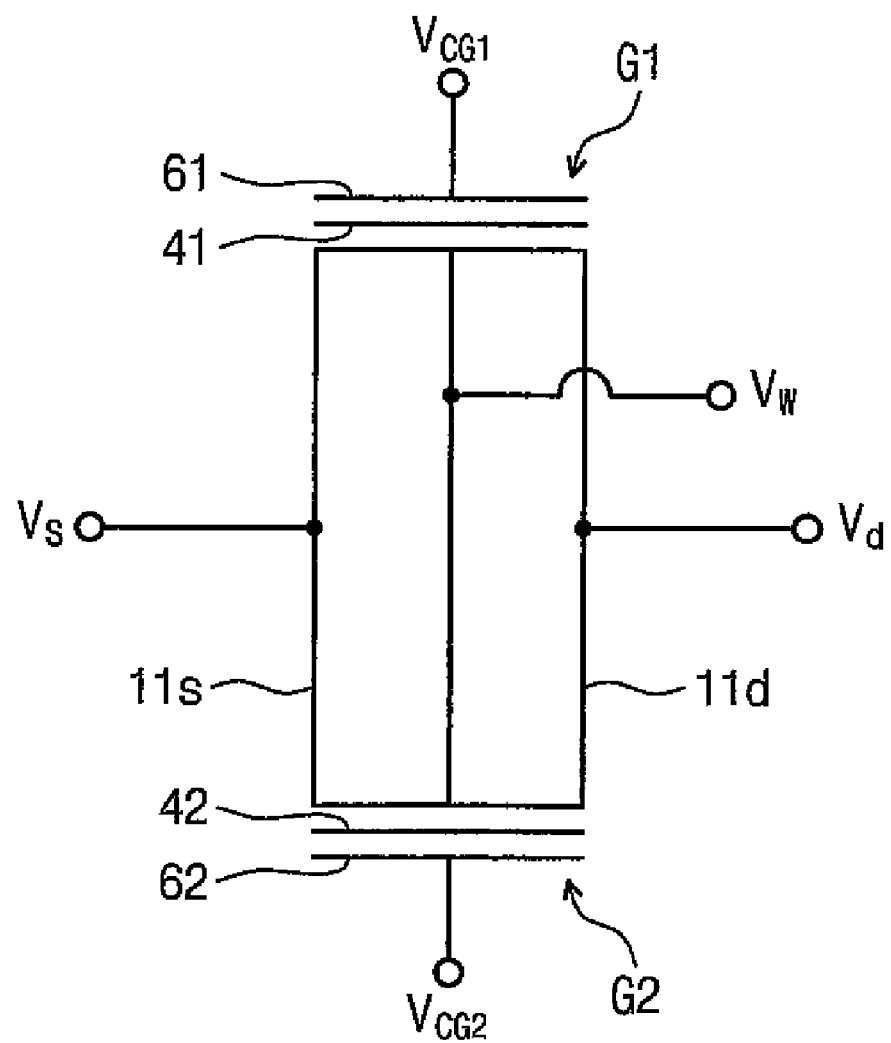
FIG. 6 is an equivalent circuit diagram illustrating a non-volatile memory cell of FIGS. 2 and 3, according to an embodiment of the present invention.

FIG. 6 is an equivalent circuit diagram of a non-volatile memory cell of FIGS. 2 and 3, according to an illustrative embodiment of the present invention. Table 1 below represents an operational condition of a device according to an embodiment of the present invention.

TABLE 1

|  | $V_{CG1}$ | $V_{CG2}$ | Vd | Vs | Vw | CS41 | CS42 |
|---|---|---|---|---|---|---|---|
| Program | Vpg | GND | — | — | GND | P | — |
|  | GND | Vpg | — | — | GND | — | P |
| Erase | Ver | Ver | — | — | GND | — | — |
| Read | Vcg.read | GND | Vd.read | GND | GND |  |  |
|  | GND | Vcg.read | Vd.read | GND | GND |  |  |

Representative data programming, reading and erasing methods will be described below with reference to FIG. 6 and Table 1.

With respect to a method for programming data, a programming electric field is applied between the first control gate 61 and the substrate. For example, positive program voltage $V_{pg}$ is applied to the first control gate 61, ground voltage GND is applied to the second control gate 62 and the substrate, and source/drain impurity regions 11s and 11d are made floating. As a result, the non-volatile memory cell is programmed by storing an electron in the first charge storage pattern 41 through Fowler-Nordheim (F-N) tunneling.

At the same or a different time, a programming electric field is applied between the second control gate 62 and the substrate. For example, positive program voltage $V_{pg}$ is applied to the second control gate 62, ground voltage GND is applied to the first control gate 61 and the substrate, and source/drain impurity regions 11s and 11d are made floating. As a result, the non-volatile memory cell is programmed by storing an electron in the second charge storage pattern 42 through F-N tunneling. In an embodiment, the program voltage $V_{pg}$ may be between about 9 V and about 12 V.

Accordingly, the non-volatile memory cell has four levels to store two-bit data. The four levels include state "11" (when no electrons are stored in the first and second charge storage patterns 41 and 42), state "01" (when an electron is stored in only the first charge storage pattern 41), state "10" (when an electron is stored in only the second charge storage pattern 42), and state "00" (when electrons are stored in both the first and second charge storage patterns 41 and 42).

With respect to a method for reading data, gate read voltage Vcg.read is applied to the first control gate 61, drain read voltage Vd.drain is applied to the drain region 11d, and ground voltage GND is applied to the source region 11s and the substrate. During this state, it is determined whether an electron is stored in the first charge storage pattern 41 by sensing a drain current.

Then, gate read voltage Vcg.read is applied to the second control gate 62, drain read voltage Vd.drain is applied to the drain region 11d, and ground voltage GND is applied to the source region 11s and the substrate. It is then determined whether an electron is stored in the second charge storage pattern 42 by sensing the drain current.

By combining a determination result of whether an electron is stored in the first charge storage pattern 41 and a determination result of whether an electron is stored in the second charge storage pattern 42, a charge state of the four possible levels of the non-volatile memory cell can be read.

With respect to a method for erasing data, an erase electric field is applied between the first and second control gates 61 and 62 and the substrate. For example, in the depicted embodiment, negative erase voltage Ver is applied to the first and second control gates 61 and 62, ground voltage GND is applied to the substrate, and the source/drain impurity regions 11s and 11d are made floating. As a result, electrons stored in the first and second charge storage patterns 41 and 42 are erased through F-N tunneling.

Figure 7A:
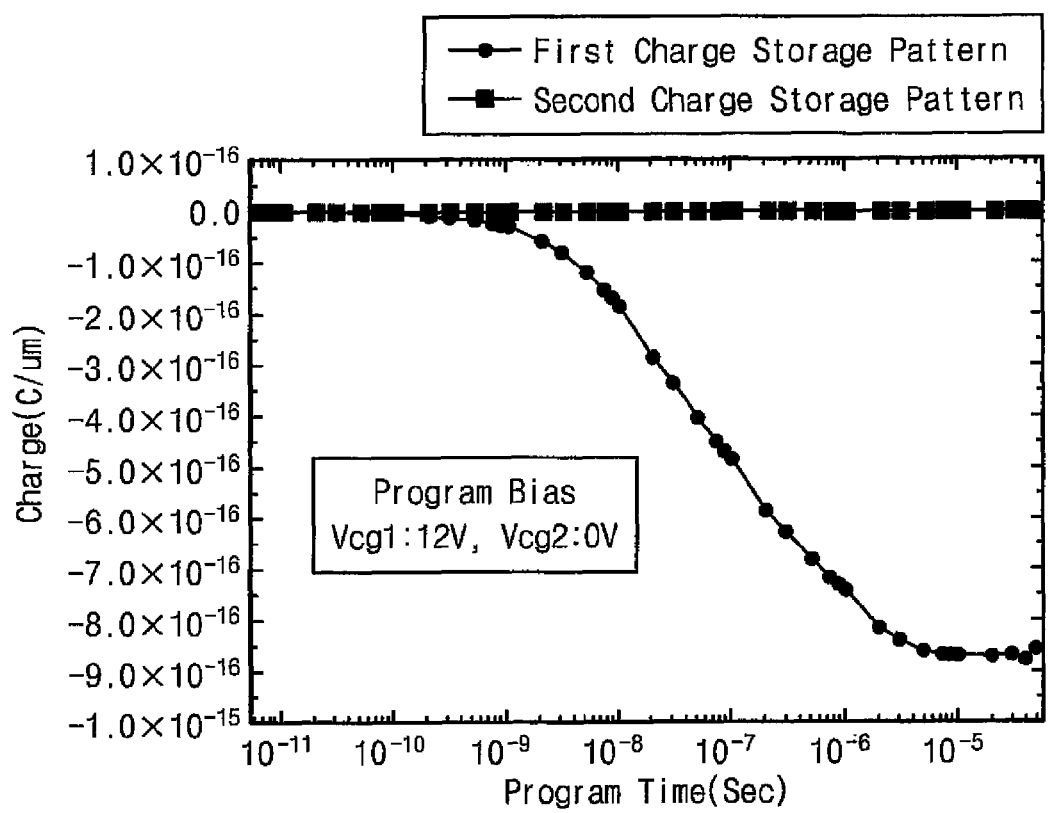
FIG. 7A a graph illustrating charges of charge storage patterns relative to program times during a programming operation of a non-volatile memory cell, according to an embodiment of the present invention.
Figure 7B:
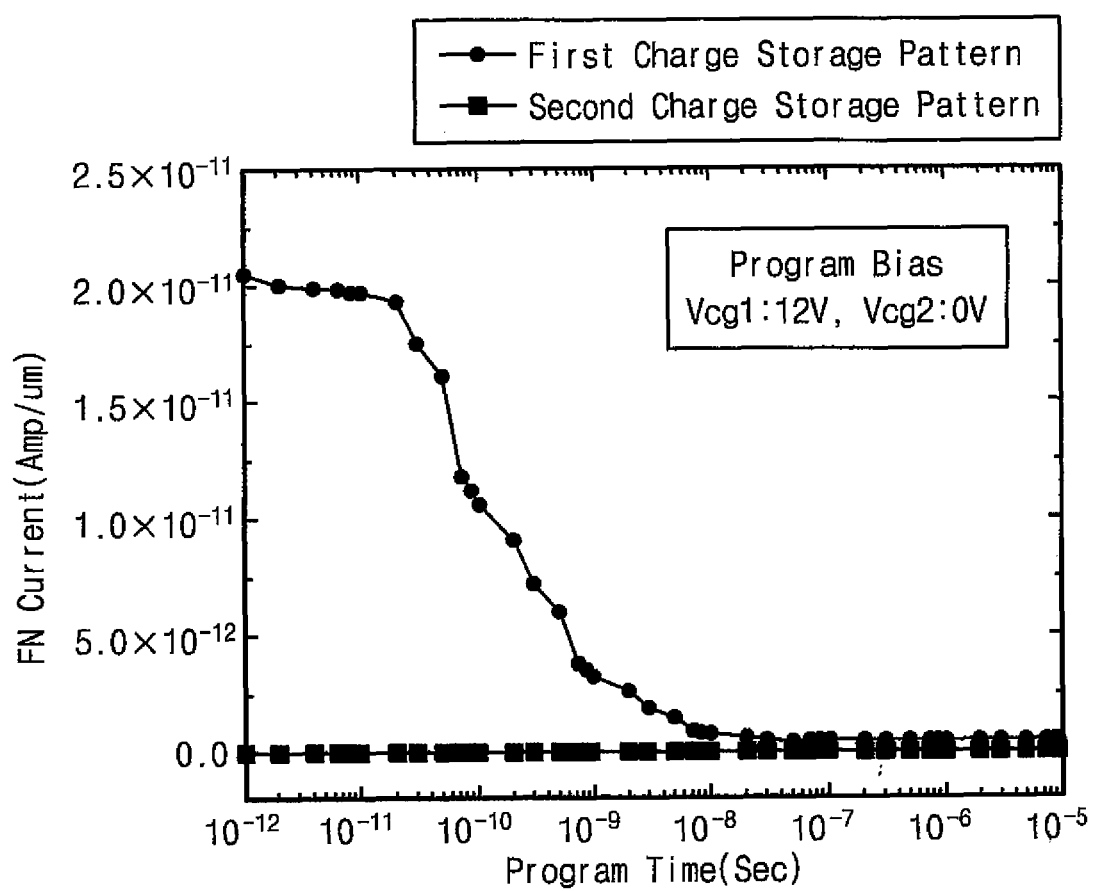
FIG. 7B is a graph illustrating F-N currents relative to a program times during a programming operation of a non-volatile memory cell, according to an embodiment of the present invention.

FIG. 7A a graph showing charges of charge storage patterns in relation to program times during a programming operation of a non-volatile memory cell, according to an illustrative embodiment of the present invention. FIG. 7B is a graph illustrating F-N currents in relation to program times during a programming operation of a non-volatile memory cell, according to an illustrative embodiment of the present invention.

Referring to FIGS. 7A and 7B, when voltage Vcg1 applied to the first control gate 61 is set with a program voltage of about 12 V, and voltage Vcg2 applied to the second control gate 62 is set with a ground voltage during a programming operation, charges of about $-8.5 \times 10^{-16}$ C/cm are stored in the first charge storage pattern 41 and no charge is stored in the second charge storage pattern 42. Additionally, because an F-N current is measured during the storing of charges, the storing of the charges may occur through F-N tunneling.

Figure 8:
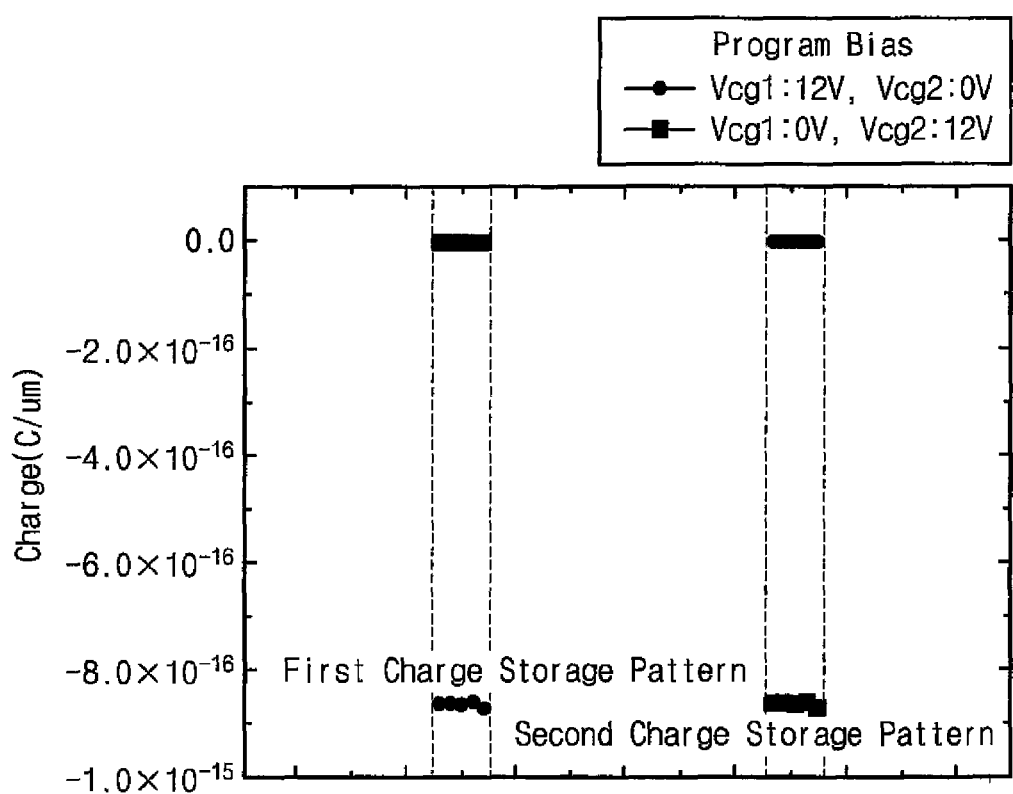
FIG. 8 is a graph illustrating charges of charge storage patterns of a non-volatile memory cell based on program biases, according to an embodiment of the present invention.

FIG. 8 is a graph showing charges of charge storage patterns of a non-volatile memory cell in relation to program biases, according to an illustrative embodiment of the present invention.

Referring to FIG. 8, when voltage Vcg1 applied to the first control gate 61 is set with a program voltage of about 12 V, and voltage Vcg2 applied to the second control gate 62 is set with a ground voltage during a programming operation, charges of about $-8.5 \times 10^{-16}$ C/cm are stored in the first charge storage pattern 41 and no charge is stored in the second charge storage pattern 42 (indicated by ●). In comparison, when voltage Vcg2 applied to the second control gate 62 is set with a program voltage of about 12 V and voltage Vcg1 applied to the first control gate 61 is set with a ground voltage during a programming operation, charges of about $-8.5 \times 10^{-16}$ C/cm are stored in the second charge storage pattern 42 and no charge is stored in the first charge storage pattern 41 (indicated by |).

Figure 9:
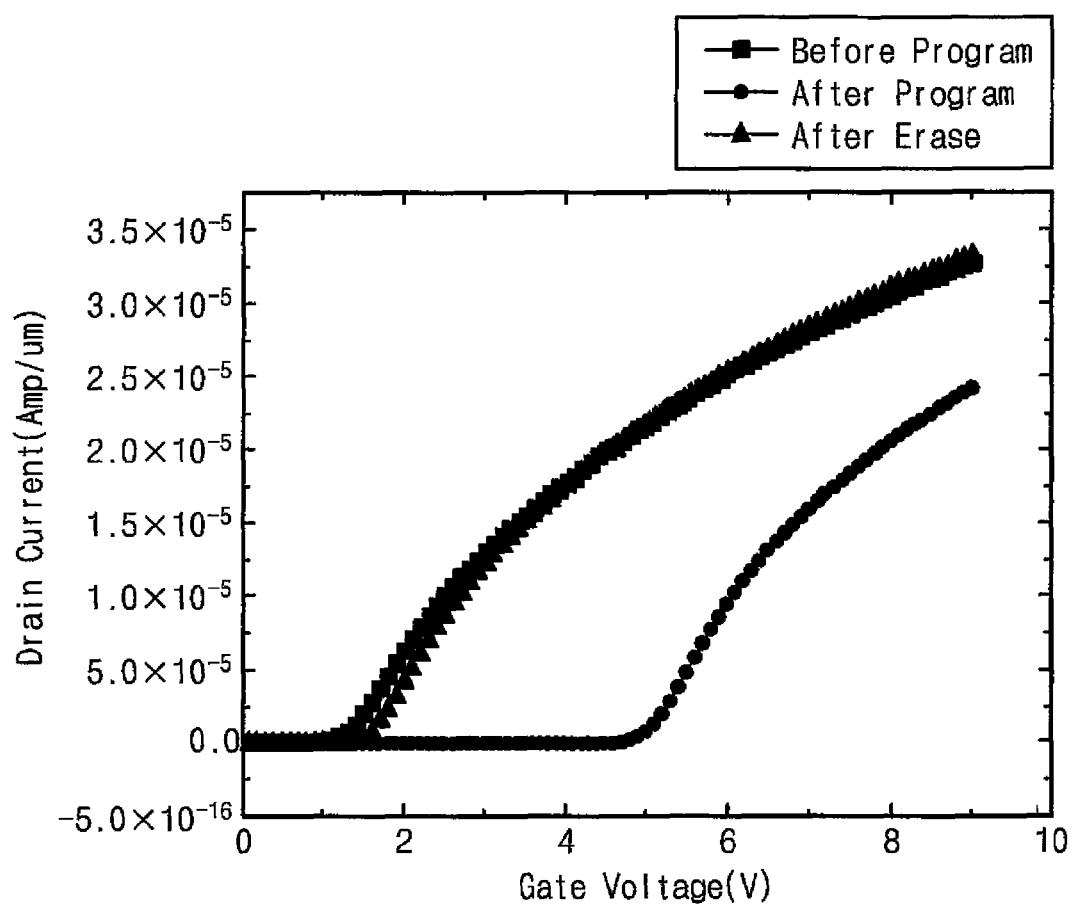
FIG. 9 is a graph illustrating drain currents based on gate voltages of a non-volatile memory cell, according to one embodiment of the present invention.

FIG. 9 is a graph showing drain currents in relation to gate voltages of a non-volatile memory cell, according to an illustrative embodiment of the present invention.

Referring to FIG. 9, a threshold voltage of a non-volatile memory cell is about 0.8 V before programming, about 4.5 V in a programmed state (storing an electron (data) in one side of a charge storage pattern), and about 1 V when the stored data are erased. Therefore, when a read voltage (e.g., about 3.5 V) is applied to the first control gate 61 during a read operation, it can be determined whether there is an electron stored in the first charge storage pattern 41. In particular, when the first charge storage pattern 41 is in a programmed state (indicated by ID), it may not be turned on at a voltage of about 3.5 V, and when the first charge storage pattern 41 is in a state before programming (indicated by |) or in a state after erasing (indicated by ▲), it may be turned on at a voltage of about 3.5 V.

Figure 10A:
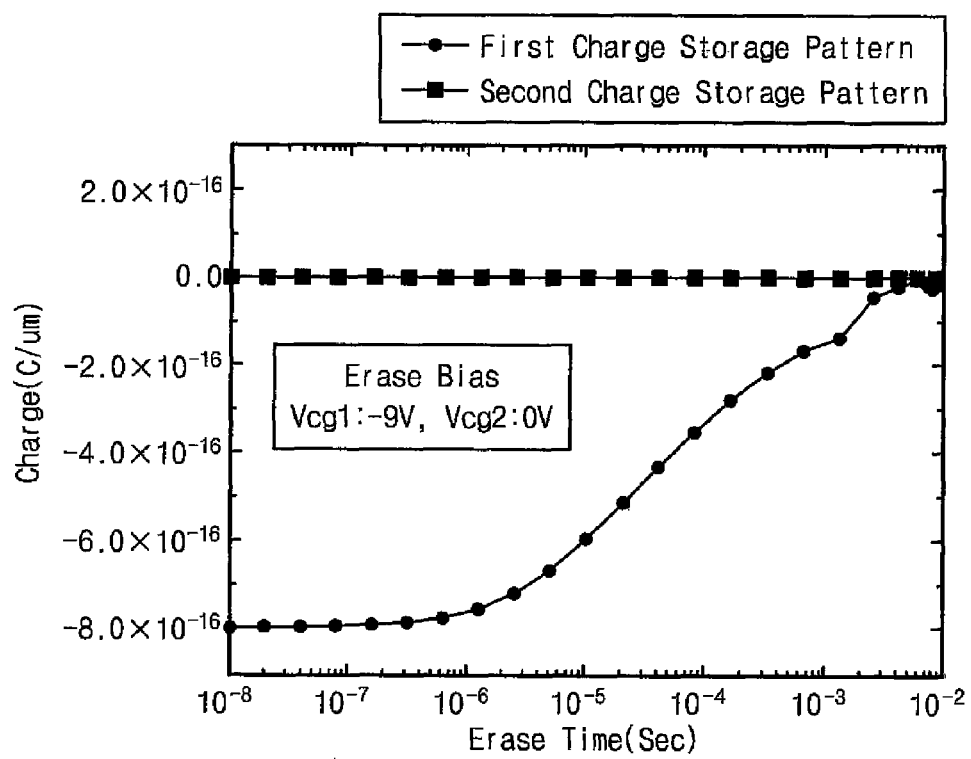
FIG. 10A is a graph illustrating charges of charge storage patterns relative to erase times during an erasing operation of a non-volatile memory cell, according to an embodiment of the present invention.
Figure 10B:
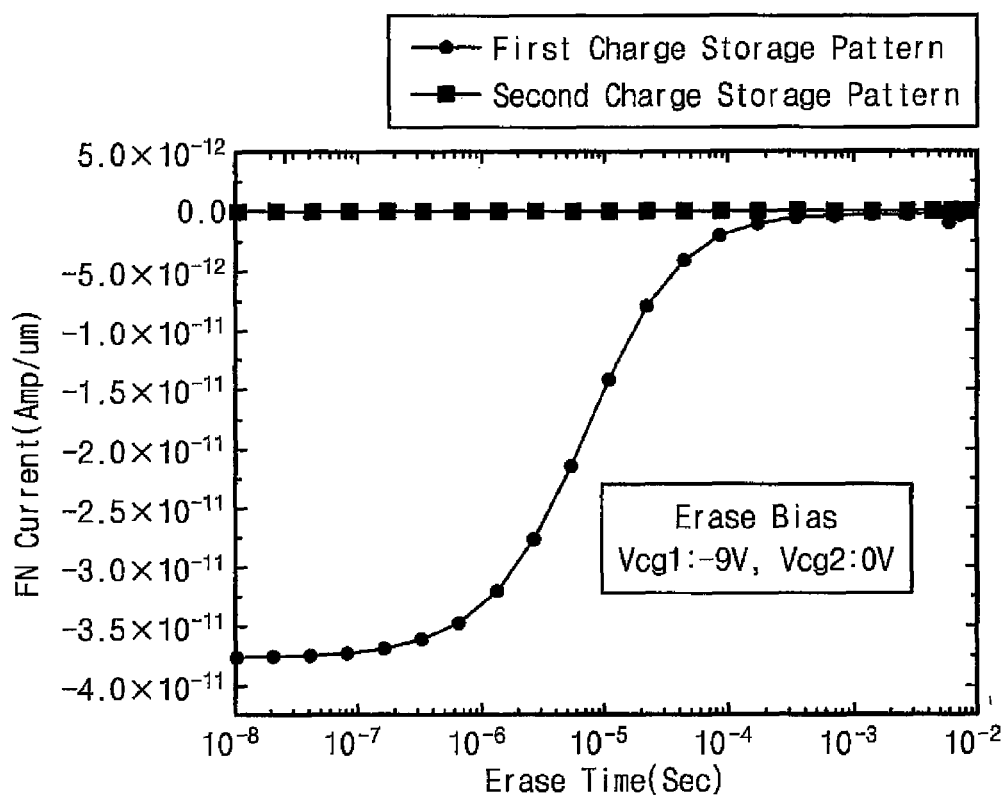
FIG. 10B is a graph illustrating F-N currents relative to erase times during an erasing operation of a non-volatile memory cell, according to an embodiment of the present invention.

FIG. 10A is a graph illustrating charges of charge storage patterns in relation to erase times during an erasing operation of a non-volatile memory cell, according to an illustrative embodiment of the present invention. FIG. 10B is a graph illustrating F-N currents in relation to erase times during an erasing operation of a non-volatile memory cell, according to an illustrative embodiment of the present invention.

Referring to FIG. 10A, when voltage Vcg1 applied to the first control gate 61 is set with an erase voltage of about −9 V and voltage Vcg2 applied to the second control gate 62 is set with a ground voltage during an erasing operation, charges of about −8.0×10$^{-16}$ C/cm stored in the first charge storage pattern 41 are erased. However, there is no change in the charge amount stored in the second charge storage pattern 42.

Referring to FIG. 10B, since an F-N current is measured during the erasing of charges, it is apparent that charge storing may occur through F-N tunneling.

Table 2 represents another operational condition of a non-volatile memory device according to an illustrative embodiment of the present invention.

TABLE 2

| | $V_{CG1}$ | $V_{CG2}$ | Vd | Vs | Vw | CS41 | CS42 |
|---|---|---|---|---|---|---|---|
| Program | Vpg1, Vpg2, or Vpg3 | GND | — | — | GND | P1, P2, or P3 | — |
| | GND | Vpg1, Vpg2, or Vpg3 | — | — | GND | — | P1, P2, or P3 |
| Erase | Ver | Ver | — | — | GND | — | — |
| Read | Vcg.read1 | GND | Vd.read | GND | GND | | |
| | Vcg.read2 | GND | Vd.read | GND | GND | | |
| | Vcg.read3 | GND | Vd.read | GND | GND | | |
| | GND | Vcg.read1 | Vd.read | GND | GND | | |
| | GND | Vcg.read2 | Vd.read | GND | GND | | |
| | GND | Vcg.read3 | Vd.read | GND | GND | | |

Representative data programming, reading and erasing methods will be described below with reference to FIG. 6 and Table 2.

With respect to a method for programming data, one of first, second or third programming electric fields having respectively different amplitudes is applied between the first control gate 61 and the semiconductor substrate. For example, in an embodiment, one of first, second or third program voltages Vpg1, Vpg2 and Vpg3 is applied to the first control gate 61, ground voltage GND is applied to the second control gate 62 and the substrate, and the source/drain impurity regions 11s and 11d are made floating. The first to third program voltages Vpg1, Vpg2 and Vpg3 may be 9 V, 10 V and 12 V, respectively. Accordingly, an electron is stored in the first charge storage pattern 41 through F-N tunneling. The number of electrons stored in the first charge storage pattern 41 may vary (e.g., P1, P2 or P3) according to the amplitude of a program voltage applied to the first control gate 61. Accordingly, the first charge storage pattern 41 can have any one of four levels (states "00," "01," "10" and "11") after a programming operation or no operation is performed.

At the same or a different time, one of the first to third programming electric fields having different amplitudes is applied between the second control gate 62 and the semiconductor substrate. For example, in an embodiment, one of the first to third program voltages Vpg1, Vpg2 and Vpg3 is applied to the second control gate 62, ground voltage GND is applied to the first control gate 61 and the semiconductor substrate, and the source/drain impurity regions 11s and 11d are made floating. The first to third program voltages Vpg1, Vpg2 and Vpg3 may be 9 V, 10 V and 12 V, respectively. Accordingly, an electron is stored in the second charge storage pattern 42 through F-N tunneling. The number of electrons stored in the second charge storage pattern 42 may vary (e.g., P1, P2 or P3) according to the amplitude of a program voltage applied to the second control gate 62. Accordingly, the second charge storage pattern 42 can have any one of four levels (states "00," "01," "10" and "11") after a programming operation or no operation is performed.

By combining charge states of the first and second charge storage patterns 41 and 42, the non-volatile memory cell has 16 levels of charge states, and is able to store four-bit data.

With respect to a method for reading data, when drain read voltage Vd.read is applied to the drain region 11d and ground voltage GND is applied to the second control gate 62, the source region 11s and the substrate, first, second and third gate read voltages Vcg.read1, Vcg.read2 and Vcg.read3, having different amplitudes, respectively, are sequentially applied to the first control gate 61. For example, in an embodiment, the first to third gate read voltages Vcg.read1, Vcg.read2 and Vcg.read3 may be 4.5 V, 3.5 V and 2 V, respectively. A charge state stored in the first charge storage pattern 41 can be determined when a drain current is measured for each voltage.

Next, when drain read voltage Vd.read is applied to the drain region 11d and ground voltage GND is applied to the first control gate 61, the source region 11s and the substrate, first to third gate read voltages Vcg.read1, Vcg.read2 and Vcg.read3 are sequentially applied to the second control gate 62. For example, in an embodiment, the first to third gate read voltages Vcg.read1, Vcg.read2 and Vcg.read3 may be about 4.5 V, about 3.5 V and about 2 V, respectively. A charge state stored in the second charge storage pattern 42 can be determined when a drain current is measured for each voltage.

The method for erasing data with respect to the embodiment illustrated in Table 2 is substantially the same as the method for erasing data discussed above with respect to the embodiment illustrated in Table 1. Therefore, the description of this method will not be repeated.

Figure 11A:
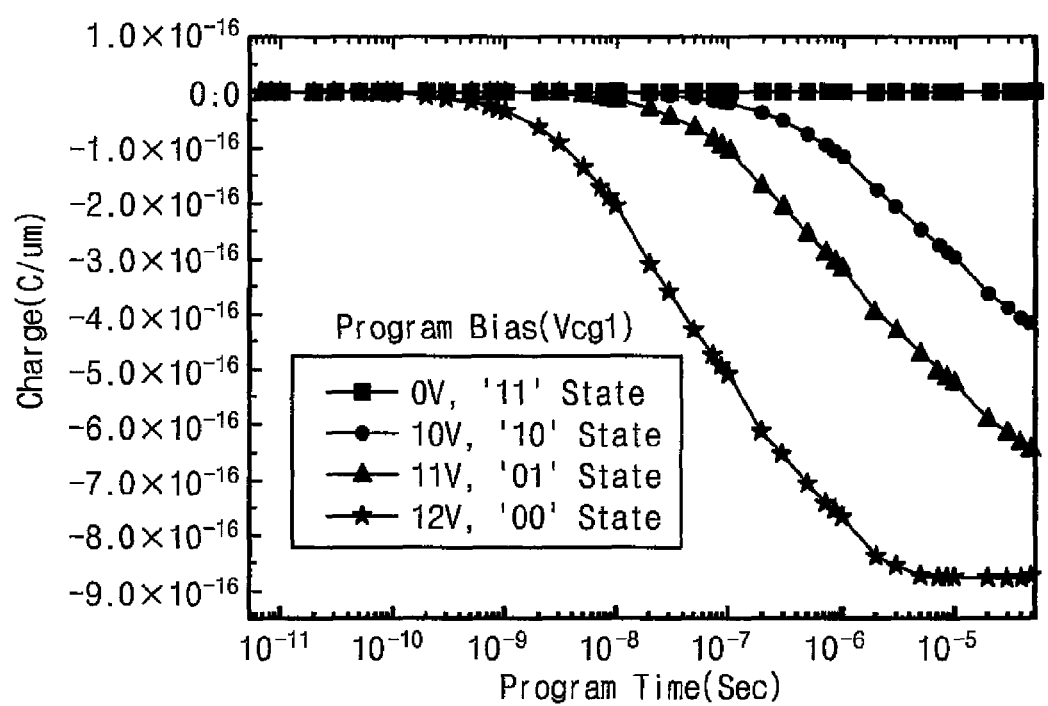
FIG. 11A is a graph illustrating charges of charge storage patterns relative to program times during a programming operation of a non-volatile memory cell, according to an embodiment of the present invention.
Figure 11B:
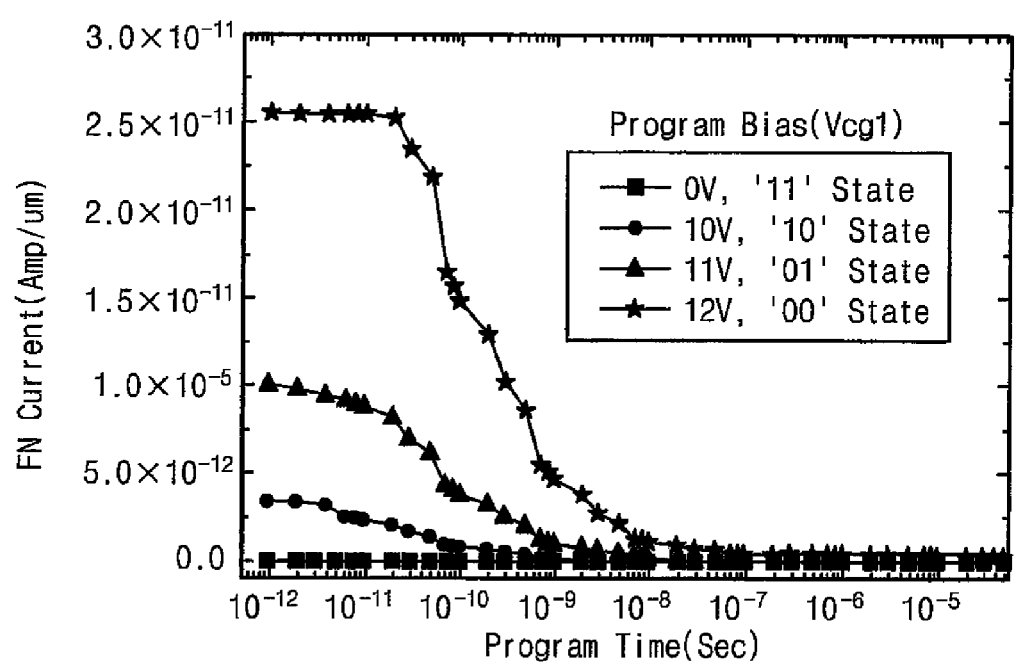
FIG. 11B is a graph illustrating F-N currents relative to program times during a programming operation of a non-volatile memory cell, according to an embodiment of the present invention.

FIG. 11A is a graph showing charges of charge storage patterns in relation to program times during a programming operation of a non-volatile memory cell, according to an illustrative embodiment of the present invention. FIG. 11B is a graph illustrating F-N currents in relation to program times during a programming operation of a non-volatile memory cell, according to an illustrative embodiment of the present invention.

Referring to FIG. 11A, when voltage Vcg1 applied to the first control gate 61 is set with a first program voltage of about 10 V, charges of about −4.2×10$^{-16}$ C/cm are stored in the first charge storage pattern 41 (state "10"). When voltage Vcg1 applied to the first control gate 61 is set with a second program voltage of about 11 V, charges of about −6.4×10$^{-16}$ C/cm are stored in the first charge storage pattern 41 (state "01"). When voltage Vcg1 applied to the first control gate 61 is set with a third program voltage of about 12 V, charges of about −8.6×10$^{-16}$ C/cm are stored in the first charge storage pattern 41 (state "00"). When the first charge storage pattern 41 is not programmed, no charge is stored in the first charge storage pattern 41 (state "11"). Accordingly, each of the charge storage patterns of the non-volatile memory cell according to embodiments of the present invention may have a charge state of one of four distinguishable levels. As a result, when combining charge states of the first and second charge storage patterns 41 and 42, the non-volatile memory cell can have 16 levels of charge states, and thus the non-volatile memory cell is able to store four-bit data.

Referring to FIG. 11B, since an F-N current is measured during charge storing, it is apparent that this charge storing may occur through F-N tunneling.

Figure 12:
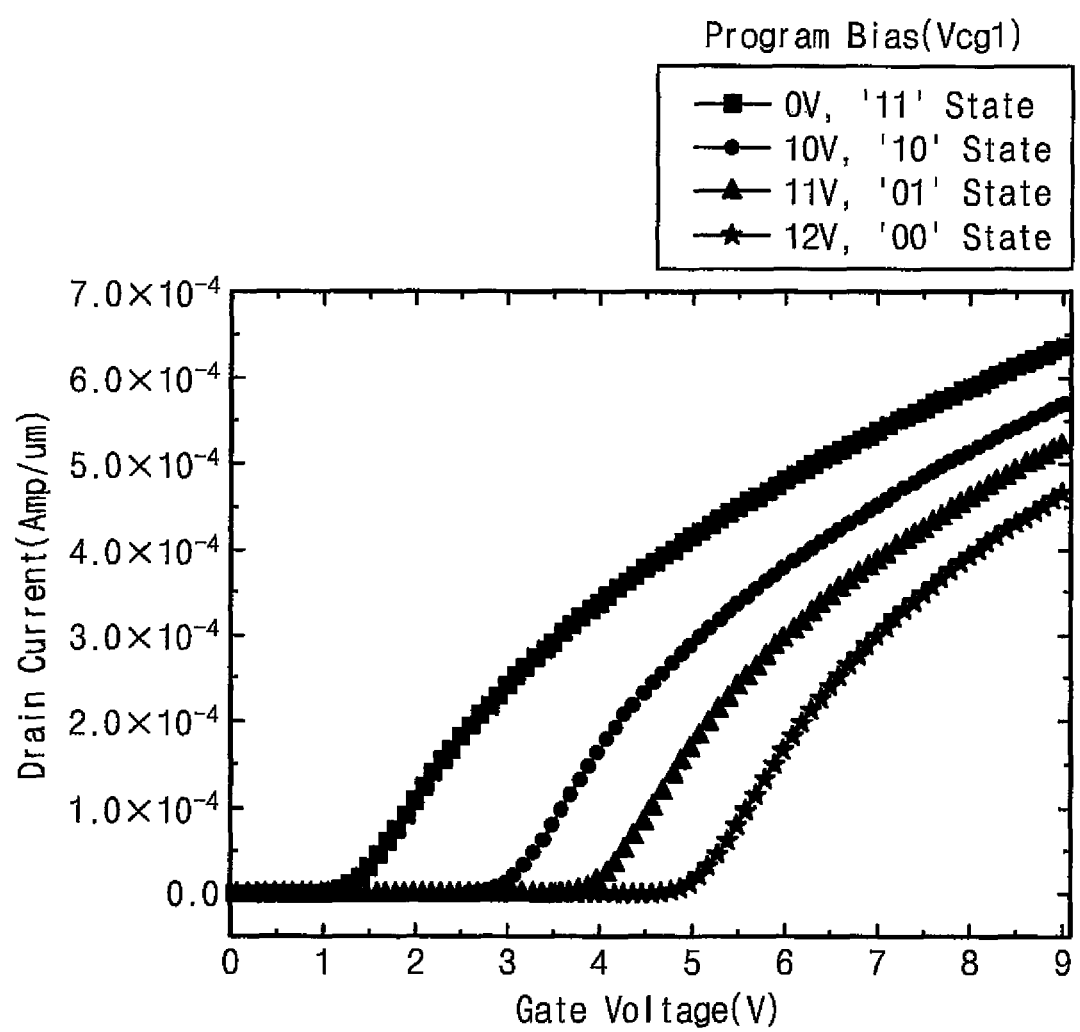
FIG. 12 is a graph illustrating drain currents based on gate voltages after performing a programming operation of a non-volatile memory cell, according to an embodiment of the present invention.

FIG. 12 is a graph showing drain currents in relation to gate voltages after performing a programming operation, according to an illustrative embodiment of the present invention.

Referring to FIG. 12, a threshold voltage of a non-volatile memory cell is about 1 V in state "11," about 2.7 V in state "10," about 3.7 V in state "01" and about 4.7 V in state "00." Accordingly, when read voltages (e.g., voltages of about 2 V, about 3.3 V and about 4.3 V) are sequentially applied to the first control gate 61, charge states stored in the first charge storage pattern 41 can be determined. More particularly, when the first charge storage pattern 41 is in state "11," it is turned on at all read voltages. When the first charge storage pattern 41 is in state "10," it is turned on at a voltage of about 3.3 V or about 4.3 V. When the first charge storage pattern 41 is in state "01," it is turned on at only a voltage of about 3.3 V. When the first charge storage pattern 41 is in state "11," it is turned on at only a voltage of about 4.3 V. Therefore, charge states corresponding to four levels in each charge storage pattern of a non-volatile memory cell can be stably read.

According to one or more embodiments of the present invention, respectively separated charge storage patterns on sidewalls of a channel region can have two levels of independent charge states. Because each charge storage pattern stores a one-bit individually, the unit cell can store a two-bit. Accordingly, the unit cell stores twice the information as compared to a unit cell storing only a one-bit. Further, programming errors can be reduced as compared to storing four charge states in one charge storage pattern.

Additionally, a channel region is more recessed as compared to source/drain regions. Therefore, the channel length of the channel region is increased as compared to a typical flat transistor, suppressing short channel effect. Likewise, since charge storage patterns and control gates extend to the sidewalls of the channel region and the top of the channel region, the channel width is increased as compared to a typical flat transistor, suppressing short width effect.

While the present invention has been shown and described in connection with exemplary embodiments thereof, it will be apparent to those skilled in the art that various modifications can be made without departing from the spirit and scope of the invention as defined by the appended claims.

What is claimed is:

1. A data programming method of a non-volatile memory device, the method comprising:
    storing a charge in a first charge storage pattern or a second charge storage pattern by applying a programming electric field between a semiconductor substrate and a first control gate or between the semiconductor substrate and a second control gate, respectively,
    wherein the non-volatile memory device includes a semiconductor substrate having a protruding active pin with a source region, a drain region and a channel region between the source and drain regions, the first control gate being located on a first sidewall of the channel region and the second control gate being located on a second sidewall of the channel region,
    wherein the first charge storage pattern is located between the first sidewall and the first control gate, and the second charge storage pattern is located between the second sidewall and the second control gate, and wherein the second charge storage pattern is electrically isolated from the first charge storage pattern.

2. The method of claim 1, wherein the programming electric field comprises one of first, second and third programming electric fields having different amplitudes, respectively.

3. A data reading method of a non-volatile memory device, the method comprising:
    sensing a drain current by applying a reference voltage to a source region, applying a drain read voltage to a drain region, and applying a gate read voltage to a first control gate; and
    sensing the drain current by applying the reference voltage to the source region, applying the drain read voltage to the drain region, and applying the gate read voltage to a second control gate,
    wherein the non-volatile memory device includes a semiconductor substrate having a protruding active pin including the source region, the drain region and a channel region between the source and drain regions, the first control gate being located on a first sidewall of the channel region and the second control gate being located on a second sidewall of the channel region,
    wherein a first charge storage pattern is located between the first sidewall and the first control gate, and a second charge storage pattern is located between the second sidewall and the second control gate and wherein the second charge storage pattern is electrically isolated from the first charge storage pattern.

4. The method of claim 3, wherein applying the gate read voltage to each of the first control gate and the second control gate comprises sequentially applying first, second and third gate read voltages having respectively different amplitudes when the drain current is sensed.

* * * * *